US010607995B2

(12) United States Patent
Roberts et al.

(10) Patent No.: US 10,607,995 B2
(45) Date of Patent: Mar. 31, 2020

(54) MEMORY ARRAYS

(71) Applicant: Micron Technology, Inc., Boise, ID (US)

(72) Inventors: Martin C. Roberts, Boise, ID (US); Sanh D. Tang, Kuna, ID (US); Fred D. Fishburn, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/973,697

(22) Filed: May 8, 2018

(65) Prior Publication Data

US 2018/0323199 A1 Nov. 8, 2018

Related U.S. Application Data

(60) Provisional application No. 62/502,999, filed on May 8, 2017.

(51) Int. Cl.
*H01L 27/108* (2006.01)
*H01L 29/08* (2006.01)
(Continued)

(52) U.S. Cl.
CPC ...... *H01L 27/10805* (2013.01); *H01L 23/528* (2013.01); *H01L 27/1085* (2013.01);
(Continued)

(58) Field of Classification Search
CPC combination set(s) only.
See application file for complete search history.

(56) References Cited

U.S. PATENT DOCUMENTS 9,698,272 B1 * 7/2017 Ikeda ............... H01L 29/78606
2004/0232466 A1 11/2004 Birner et al.
(Continued)

FOREIGN PATENT DOCUMENTS

KR 10-2012-0069258 6/2012
WO WO 2017/034647 3/2017
(Continued)

OTHER PUBLICATIONS

Matsubayashi et al., "20-nm-node trench-gate-self-aligned crystalline in—Ga—Zn-Oxide FET with high frequency and low off-state current", IEEE International Electron Devices Meeting (IEDM), Dec. 7-9, 2015, United States, 4 pages.
(Continued)

*Primary Examiner* — Ratisha Mehta
(74) *Attorney, Agent, or Firm* — Wells St. John P.S.

(57) ABSTRACT

A memory array comprises vertically-alternating tiers of insulative material and memory cells. The memory cells individually include a transistor comprising first and second source/drain regions having a channel region there-between and a gate operatively proximate the channel region. At least a portion of the channel region is horizontally-oriented for horizontal current flow in the portion between the first and second source/drain regions. The memory cells individually include a capacitor comprising first and second electrodes having a capacitor insulator there-between. The first electrode is electrically coupled to the first source/drain region. The second capacitor electrodes of multiple of the capacitors in the array are electrically coupled with one another. A sense-line structure extends elevationally through the vertically-alternating tiers. Individual of the second source/drain regions of individual of the transistors that are in different memory cell tiers are electrically coupled to the elevation-
(Continued)

ally-extending sense-line structure. Additional embodiments are disclosed.

34 Claims, 28 Drawing Sheets

(51) Int. Cl.

| | | |
|---|---|---|
| *H01L 29/10* | (2006.01) | |
| *H01L 49/02* | (2006.01) | |
| *H01L 23/528* | (2006.01) | |
| *H01L 29/423* | (2006.01) | |
| *H01L 27/11504* | (2017.01) | |
| *H01L 27/11507* | (2017.01) | |
| *H01L 27/11514* | (2017.01) | |
| *H01L 21/28* | (2006.01) | |
| *H01L 21/02* | (2006.01) | |
| *H01L 21/306* | (2006.01) | |
| *H01L 21/311* | (2006.01) | |
| *H01L 21/3213* | (2006.01) | |
| *H01L 27/06* | (2006.01) | |

(52) U.S. Cl.
CPC .. *H01L 27/10873* (2013.01); *H01L 27/10882* (2013.01); *H01L 27/10897* (2013.01); *H01L 27/11504* (2013.01); *H01L 27/11507* (2013.01); *H01L 27/11514* (2013.01); *H01L 28/60* (2013.01); *H01L 29/0847* (2013.01); *H01L 29/1033* (2013.01); *H01L 29/42376* (2013.01); *H01L 21/0217* (2013.01); *H01L 21/02164* (2013.01); *H01L 21/02532* (2013.01); *H01L 21/02595* (2013.01); *H01L 21/28035* (2013.01); *H01L 21/30604* (2013.01); *H01L 21/31111* (2013.01); *H01L 21/32134* (2013.01); *H01L 27/0688* (2013.01)

(56) References Cited

U.S. PATENT DOCUMENTS

| | | |
|---|---|---|
| 2005/0157583 A1 | 7/2005 | Hofman |
| 2007/0161277 A1 | 7/2007 | Baars et al. |
| 2007/0236979 A1 | 10/2007 | Takashima |
| 2011/0033955 A1 | 2/2011 | Kang |
| 2011/0079836 A1 | 4/2011 | Lin |
| 2013/0069052 A1 | 3/2013 | Sandhu |
| 2013/0161607 A1* | 6/2013 | Yoneda ............... H01L 27/0688 257/43 |
| 2014/0035018 A1 | 2/2014 | Lee |
| 2014/0210026 A1 | 7/2014 | Karlsson et al. |
| 2015/0048292 A1 | 2/2015 | Park |
| 2016/0049406 A1 | 2/2016 | Sandhu |
| 2016/0322368 A1 | 11/2016 | Sun et al. |
| 2017/0018570 A1 | 1/2017 | Lue et al. |
| 2018/0323200 A1 | 11/2018 | Tang et al. |

FOREIGN PATENT DOCUMENTS

| | | |
|---|---|---|
| WO | WO 2018031498 | 8/2018 |
| WO | WO 2018031498 | 11/2019 |

OTHER PUBLICATIONS

U.S. Appl. No. 15/973,707, filed May 8, 2018, by Tang et al.
U.S. Appl. No. 16/204,224, filed Nov. 29, 2018 by Tang et al.
U.S. Appl. No. 16/192,462, filed Nov. 15, 2018 by Tang et al.

* cited by examiner

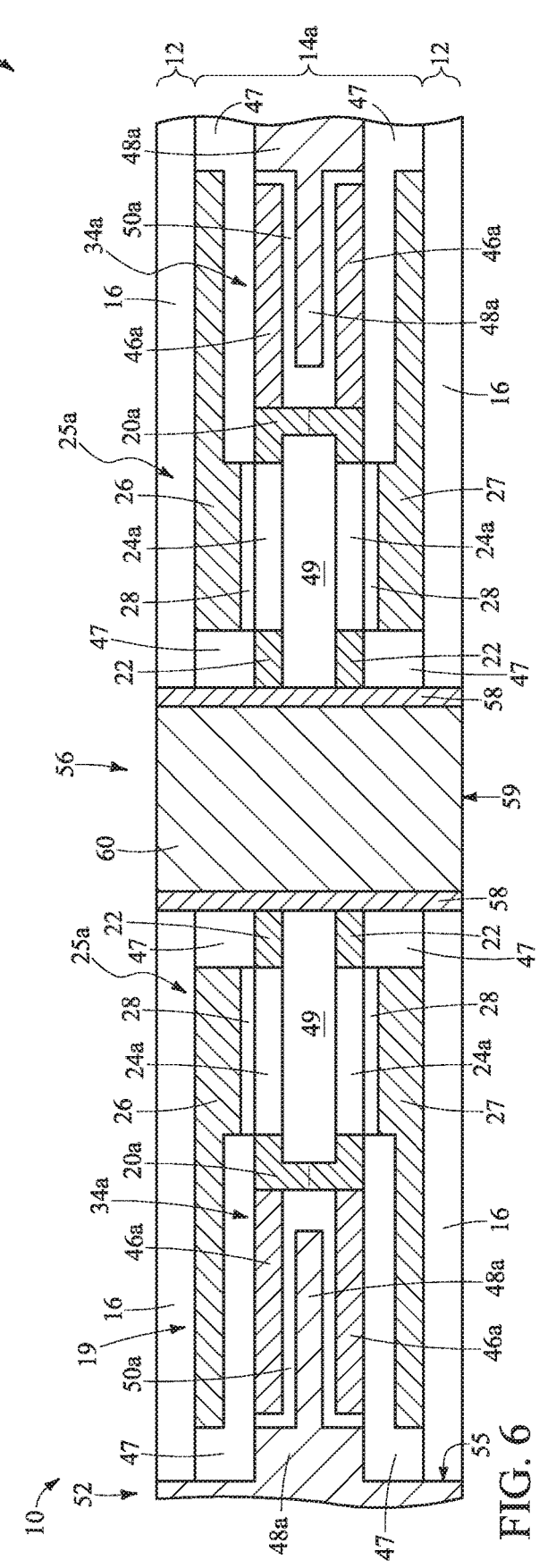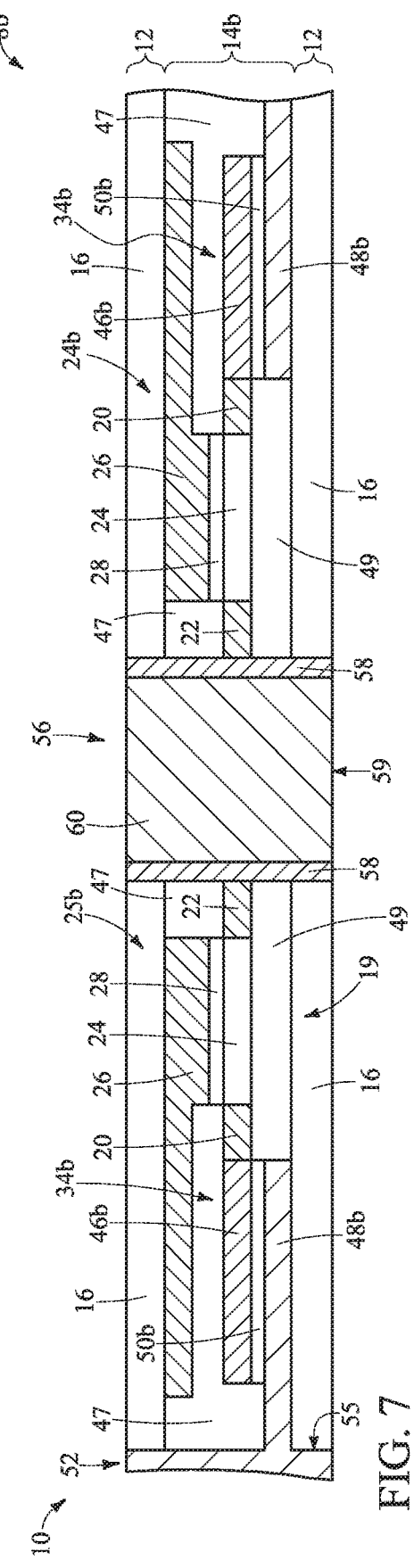

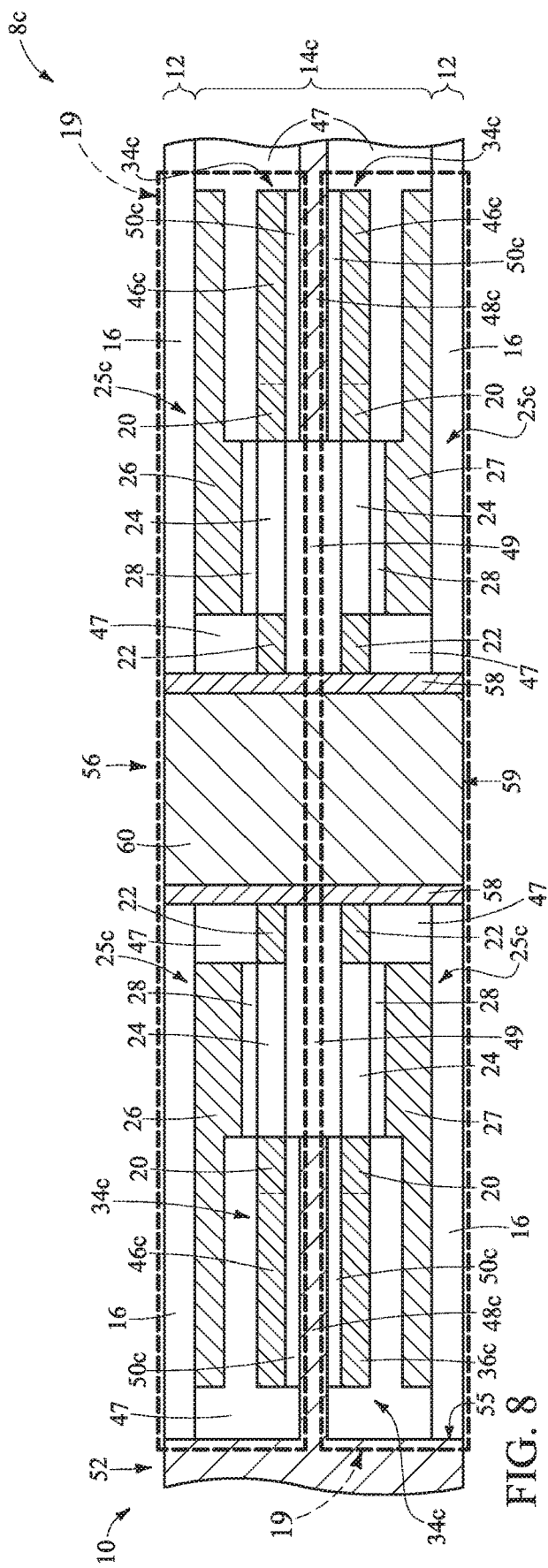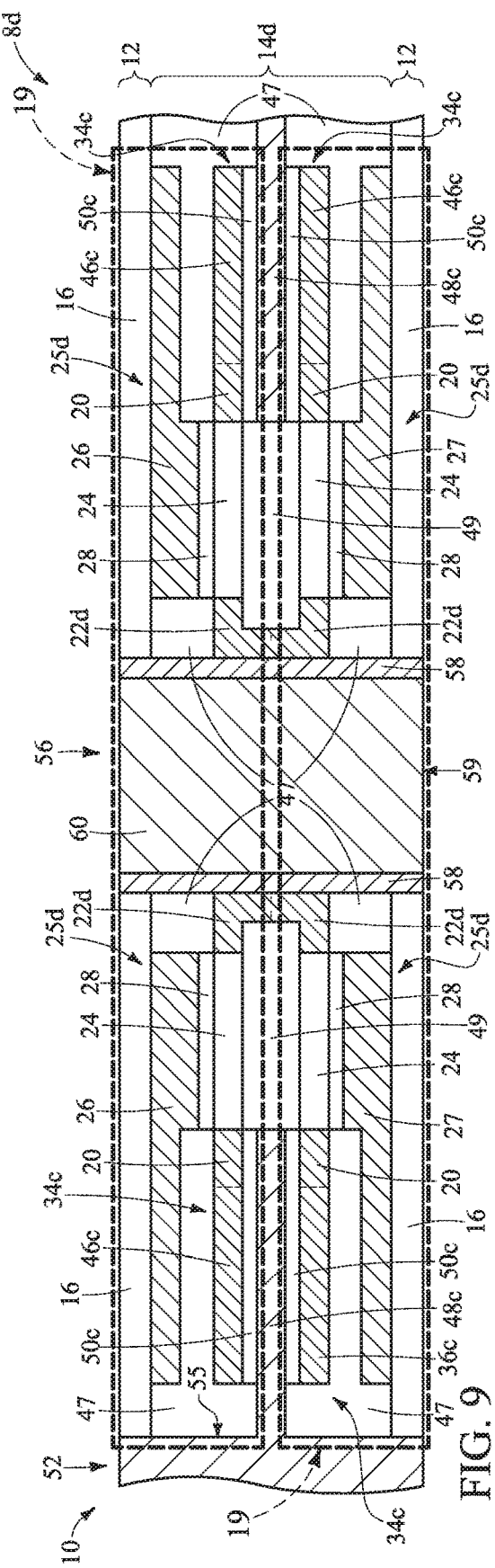

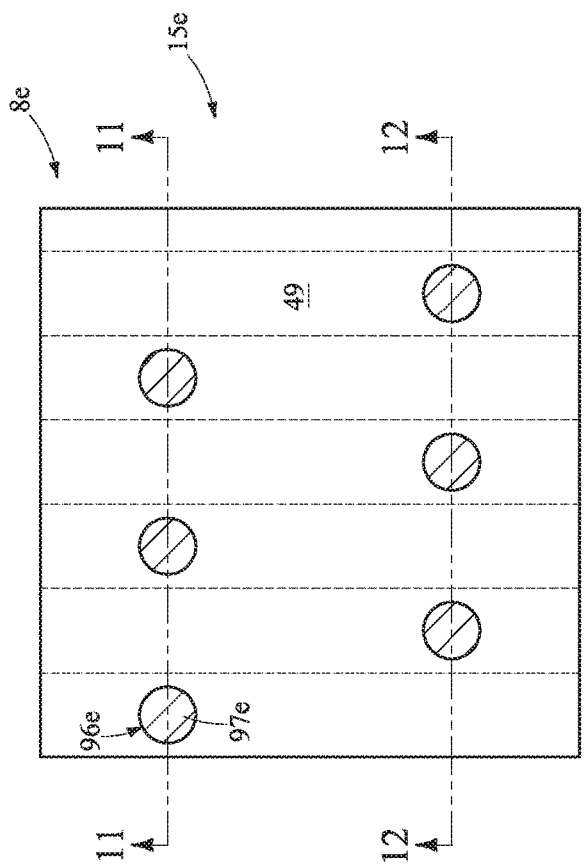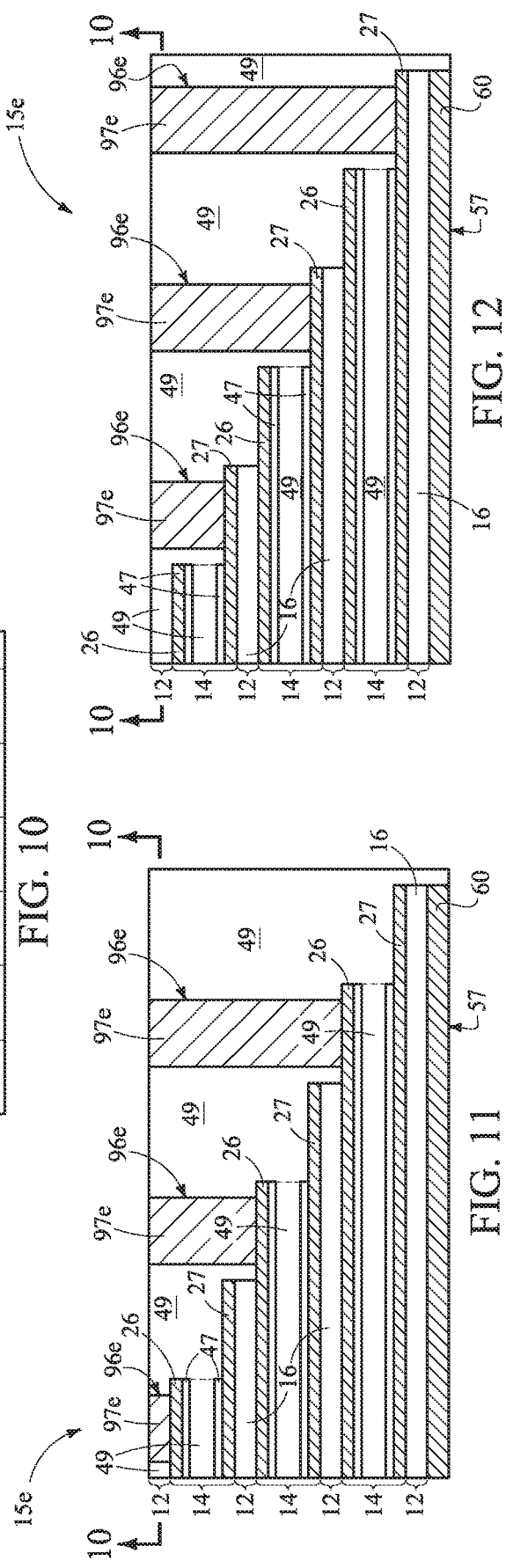

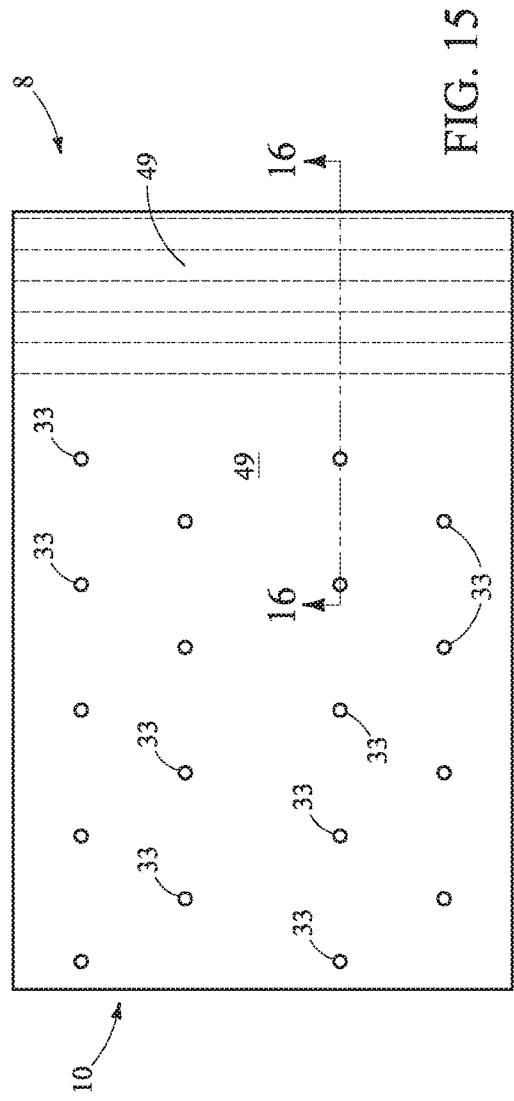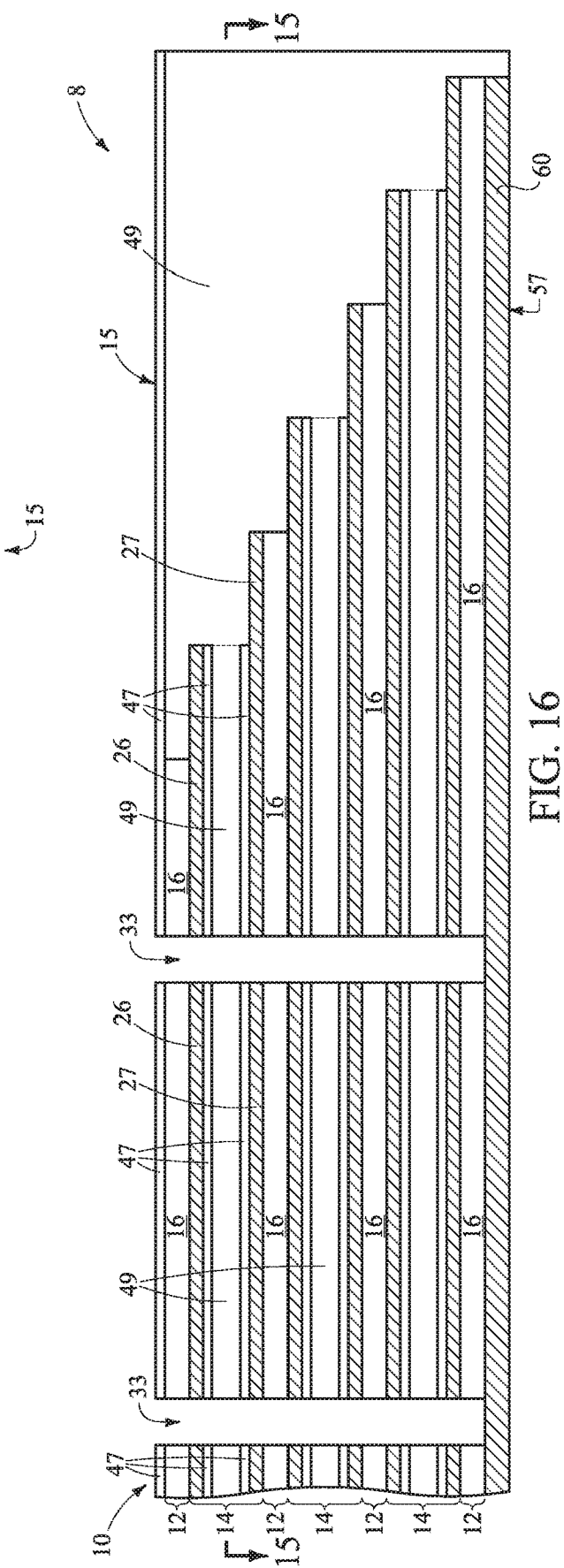
FIG. 15
FIG. 16

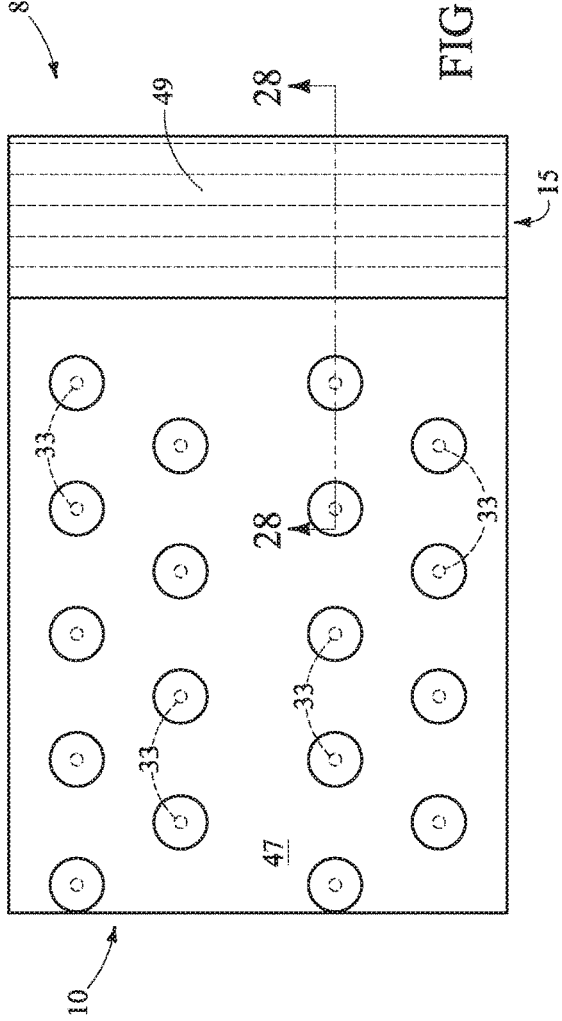
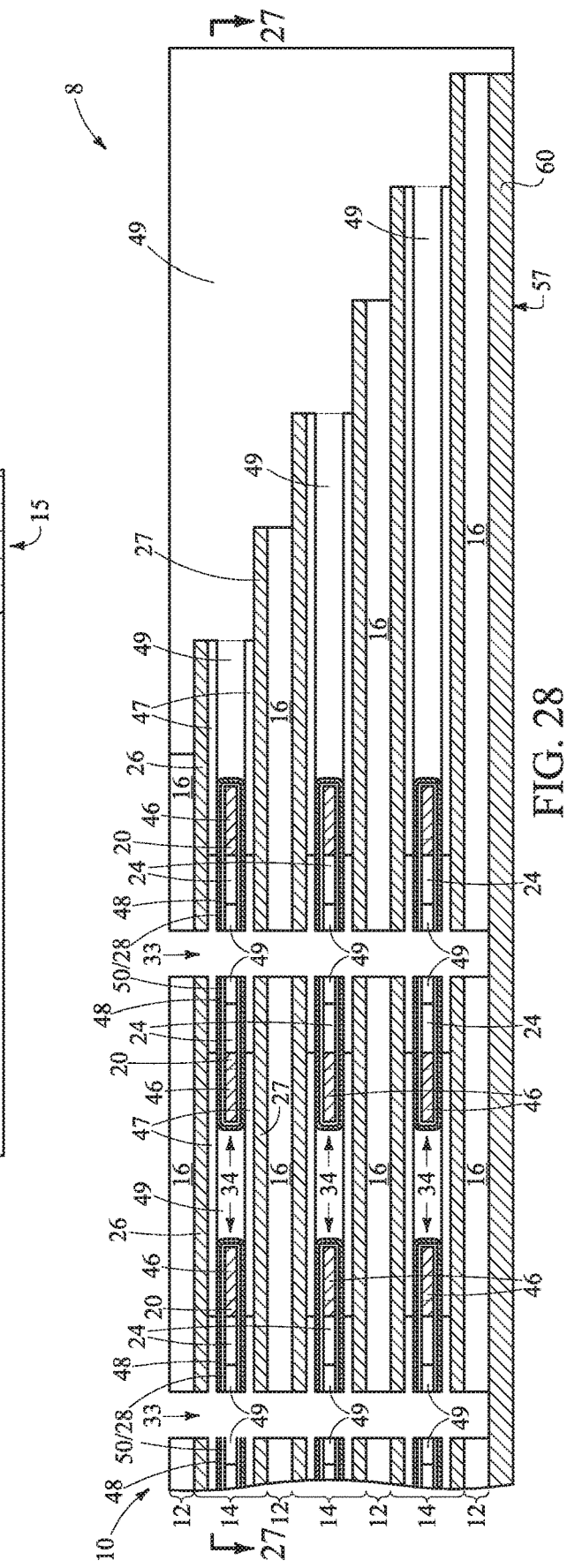
FIG. 27
FIG. 28

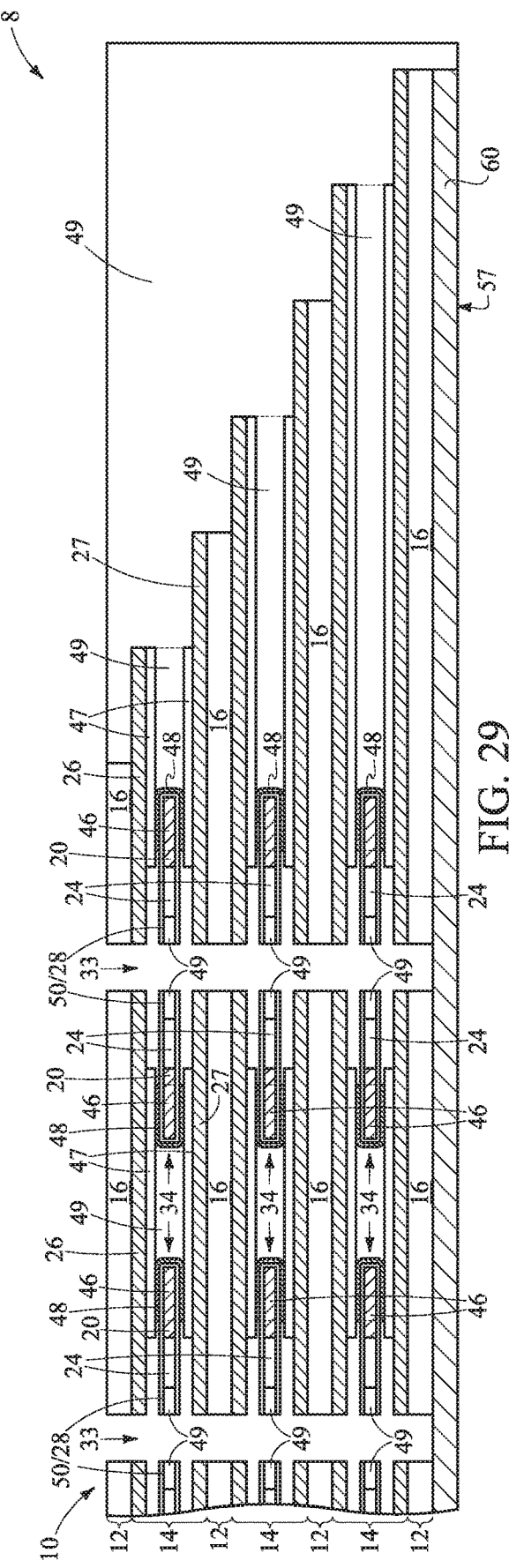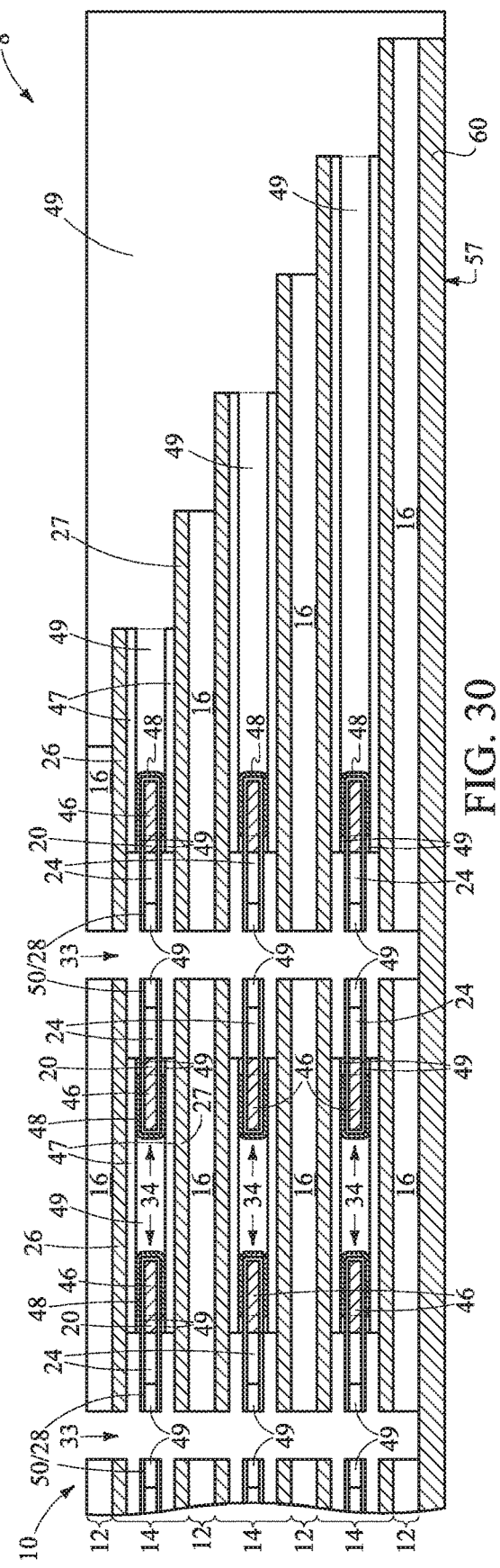

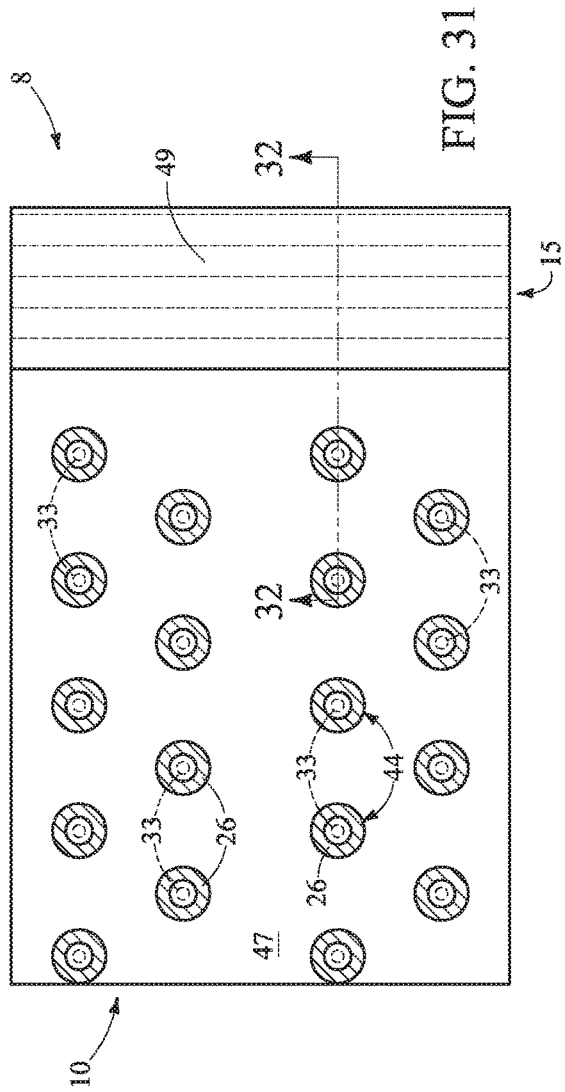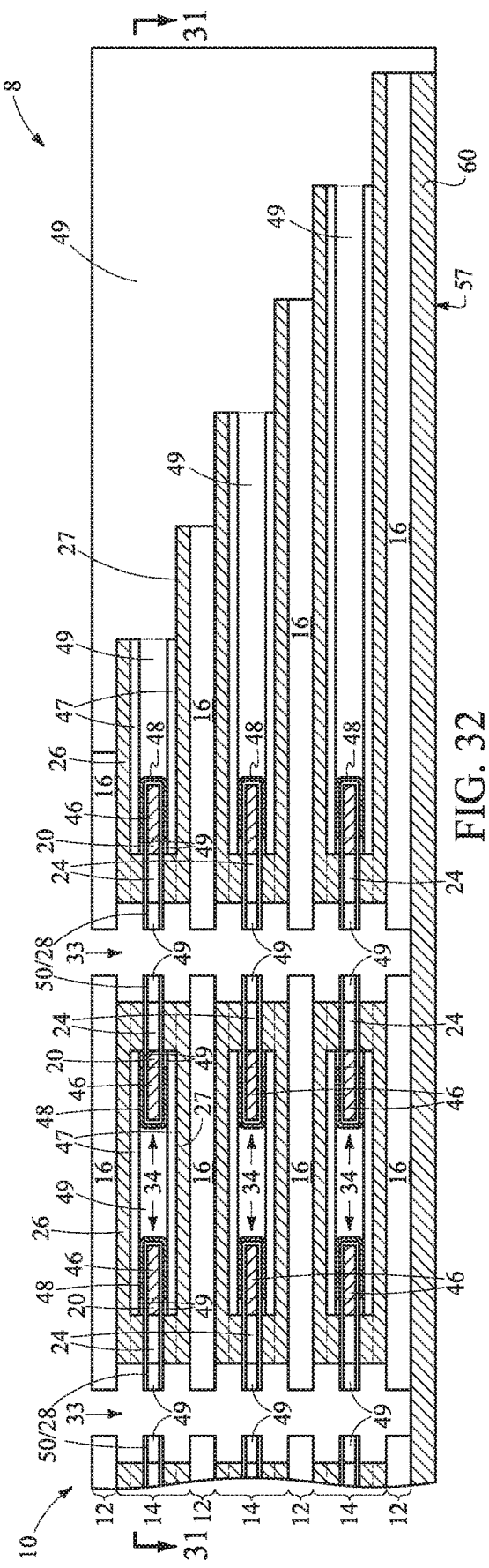

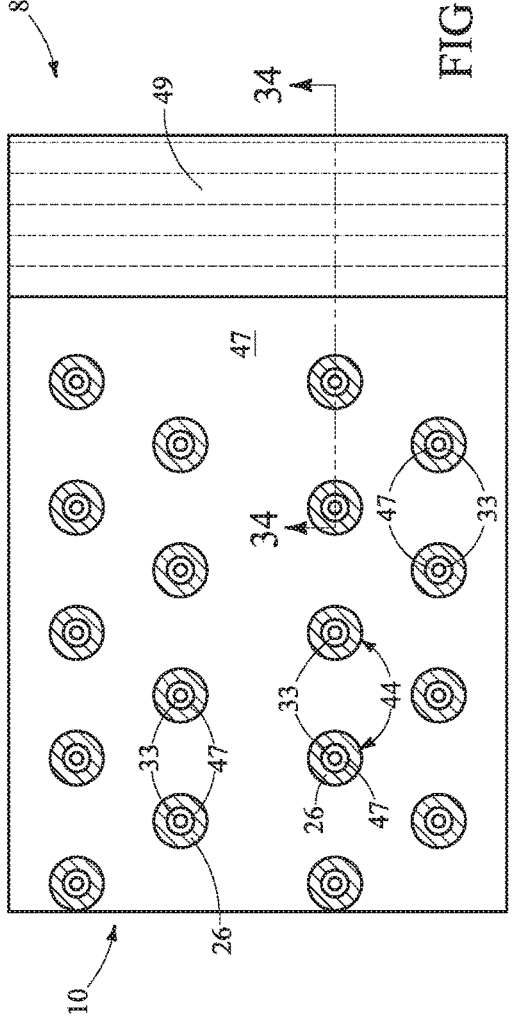
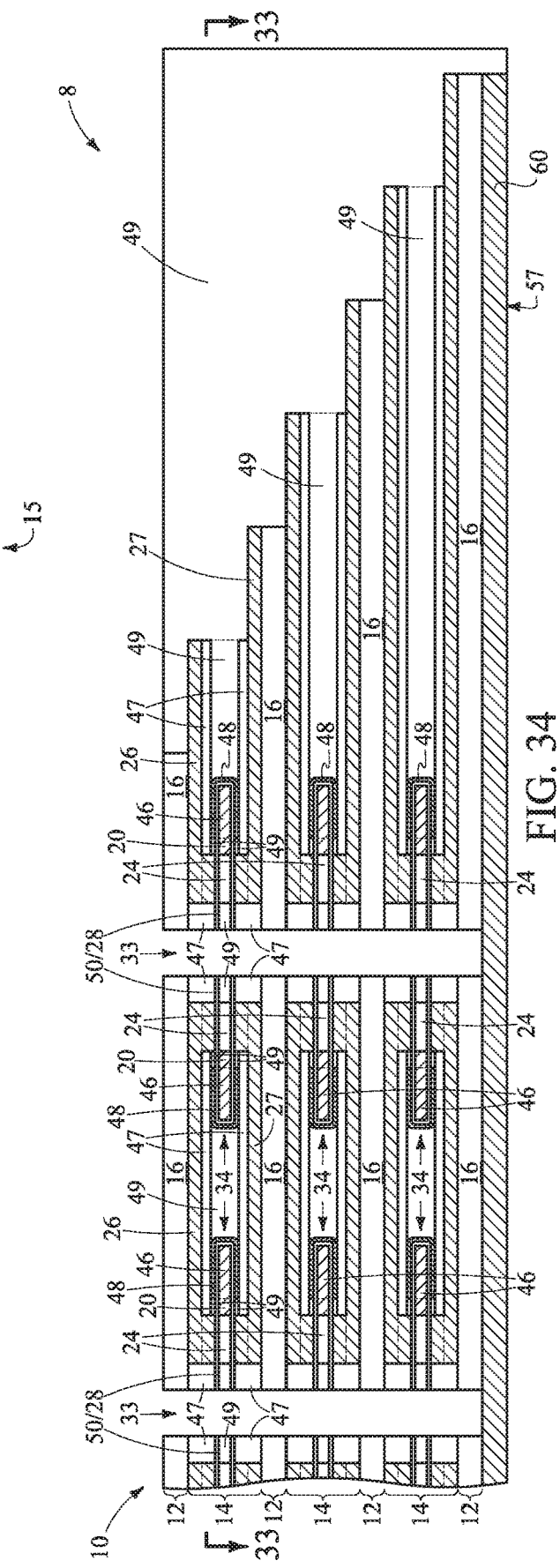
FIG. 33
FIG. 34

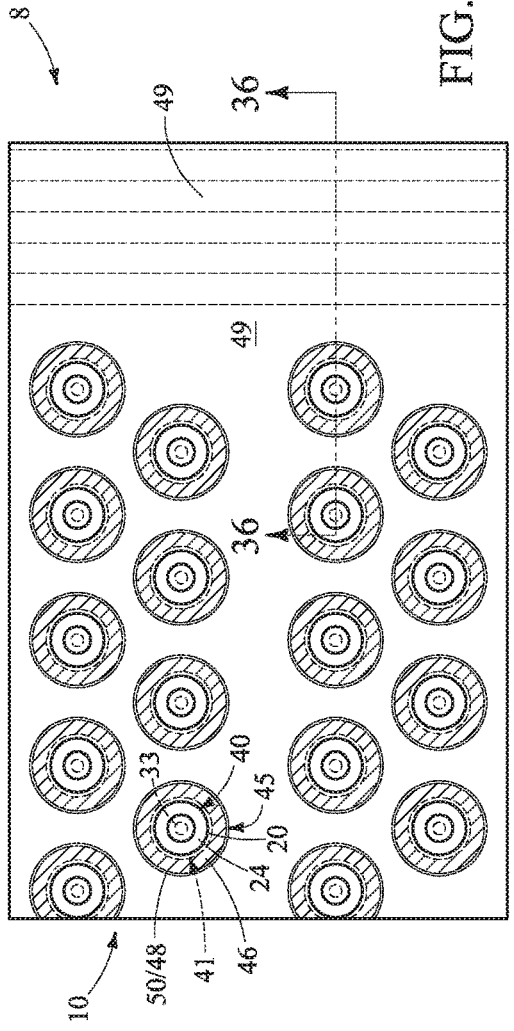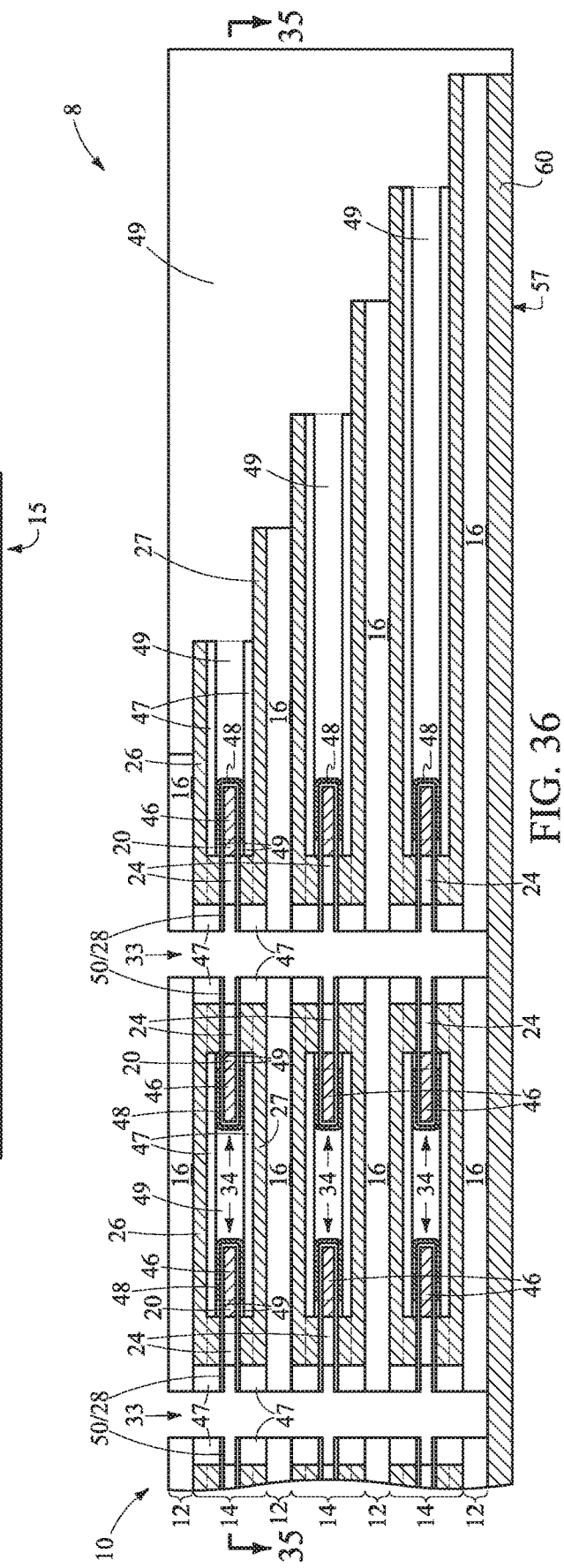

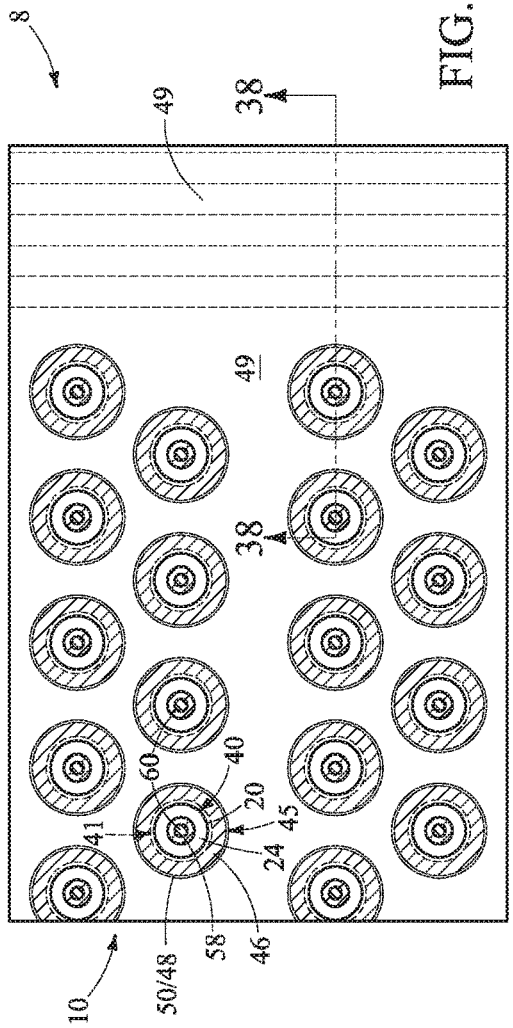
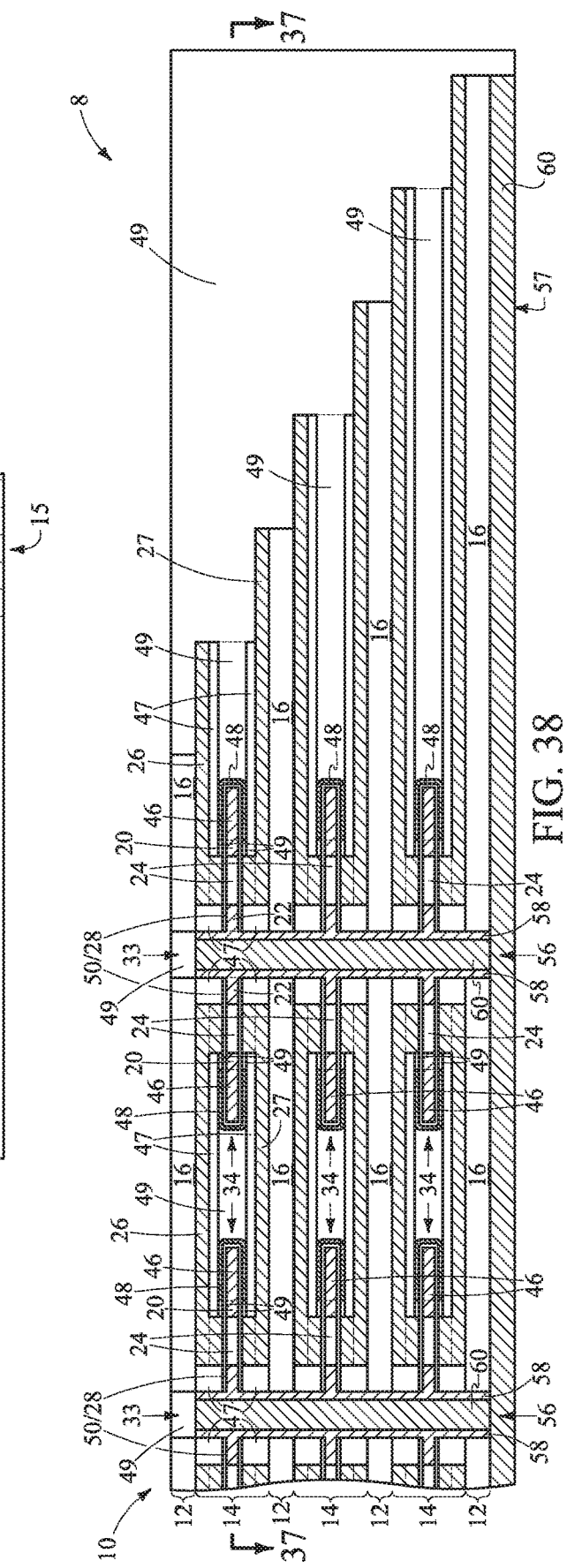
FIG. 37
FIG. 38

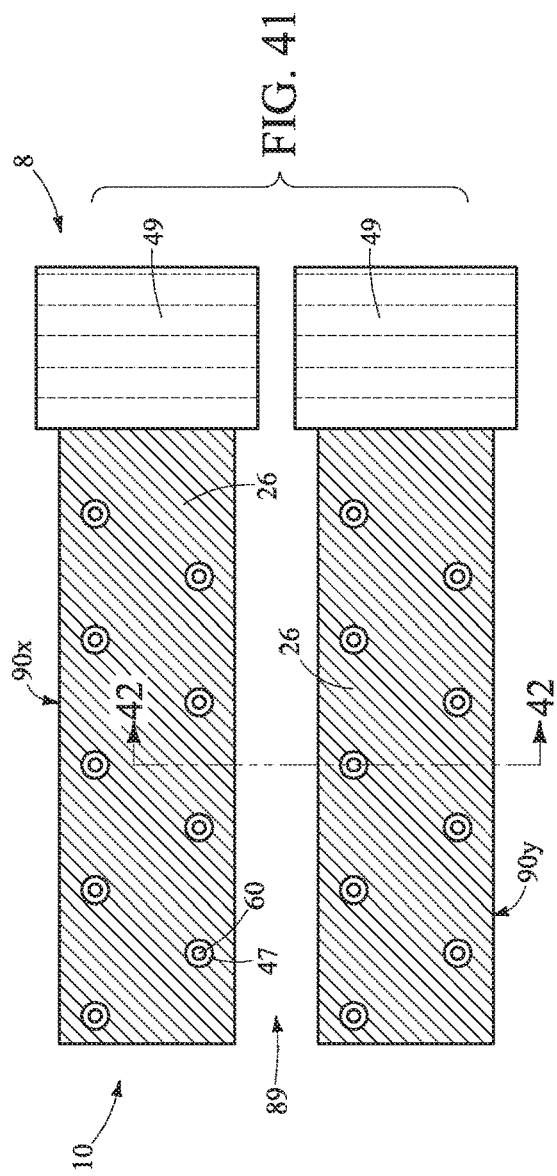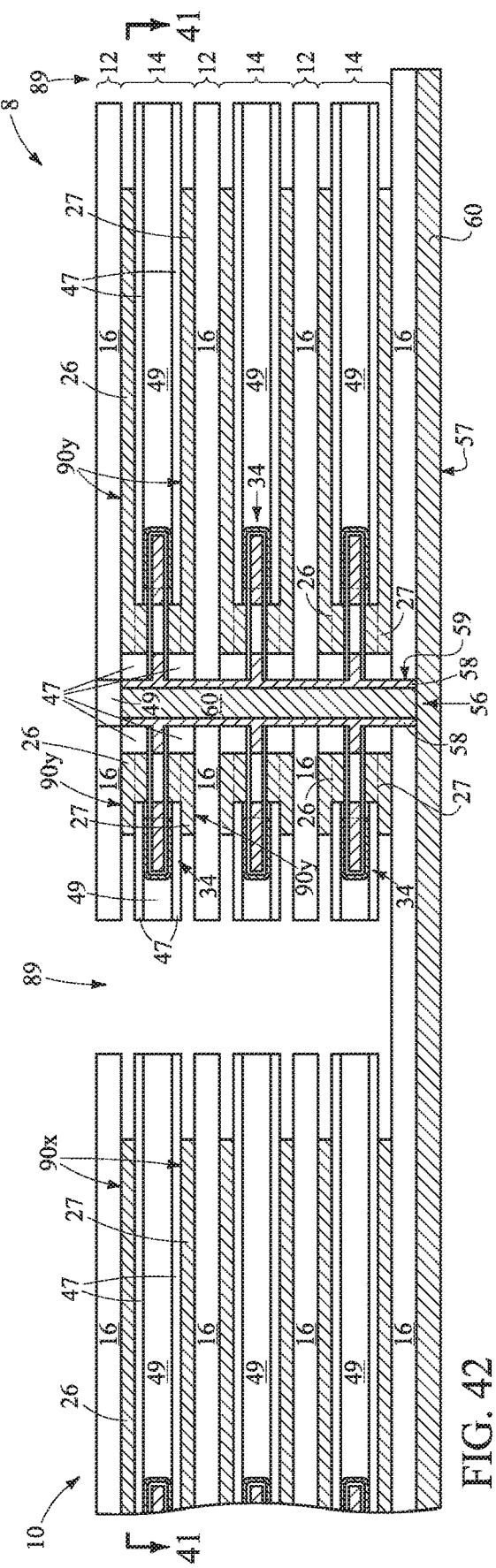
FIG. 41
FIG. 42

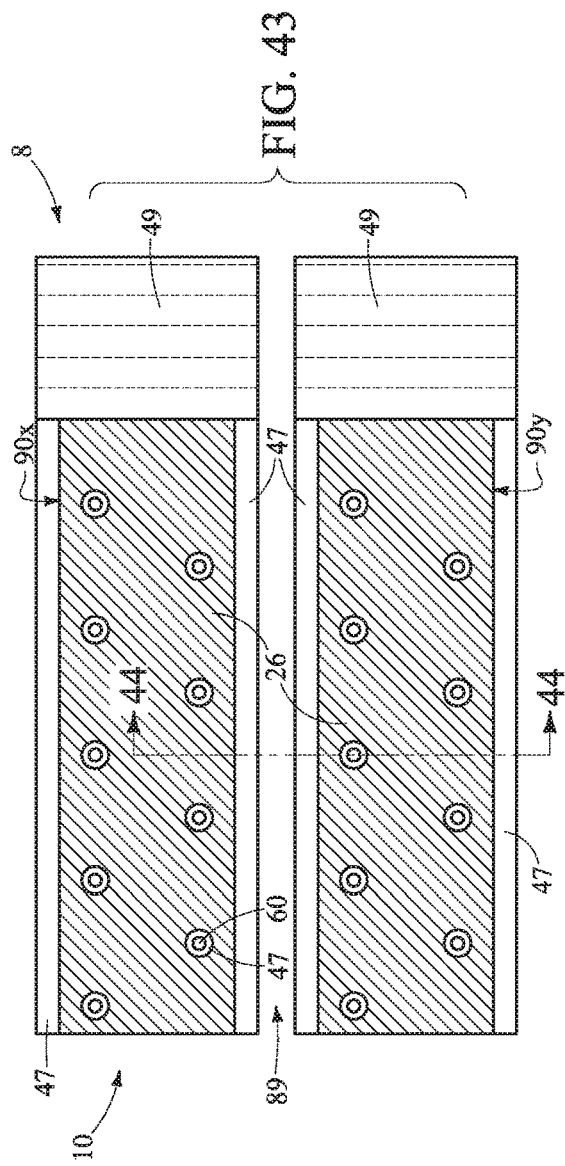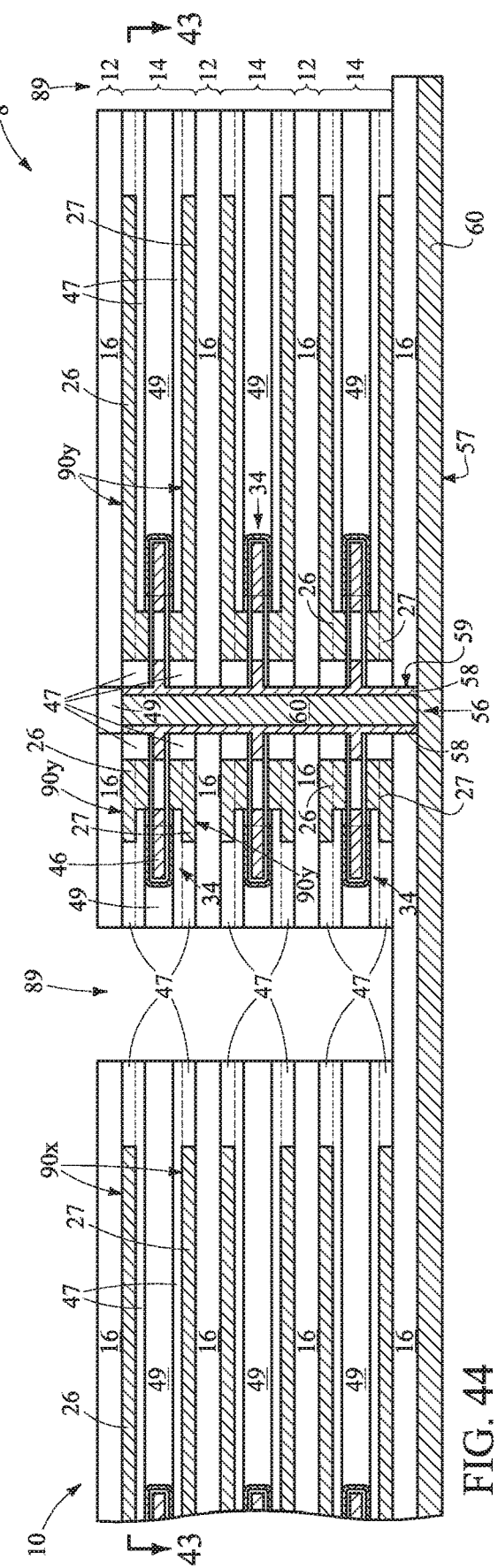

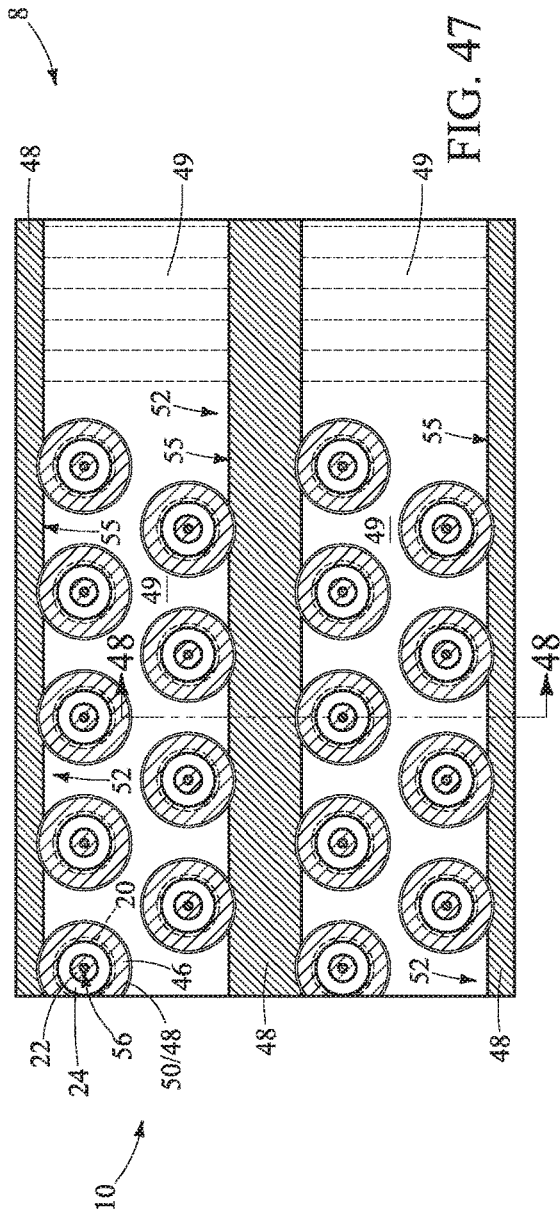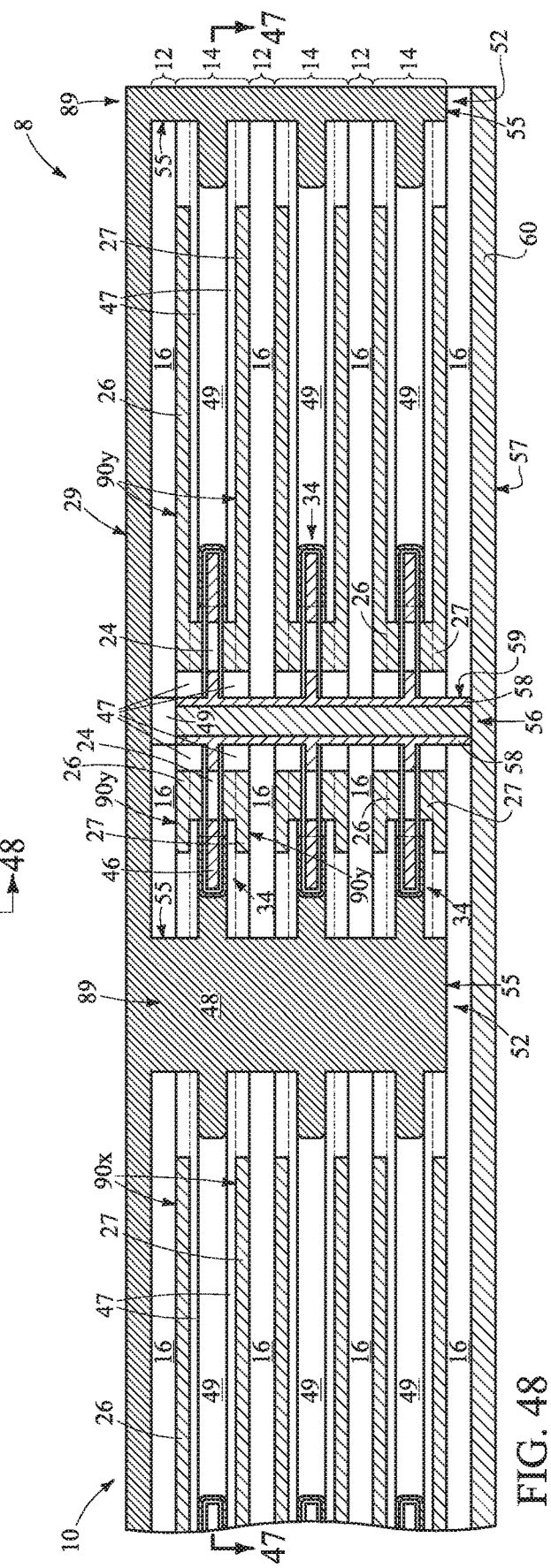
FIG. 47
FIG. 48

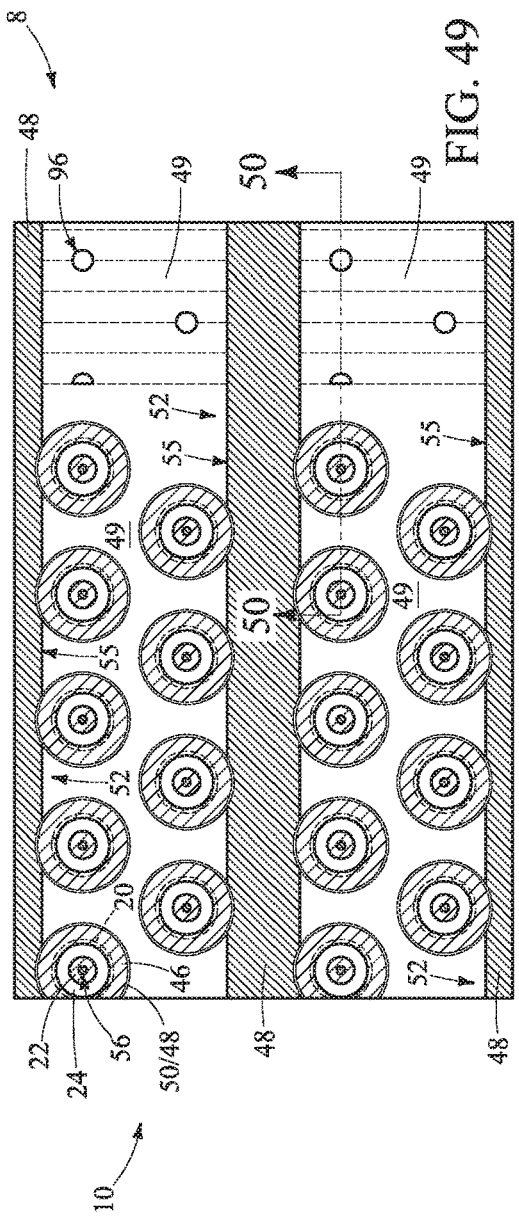
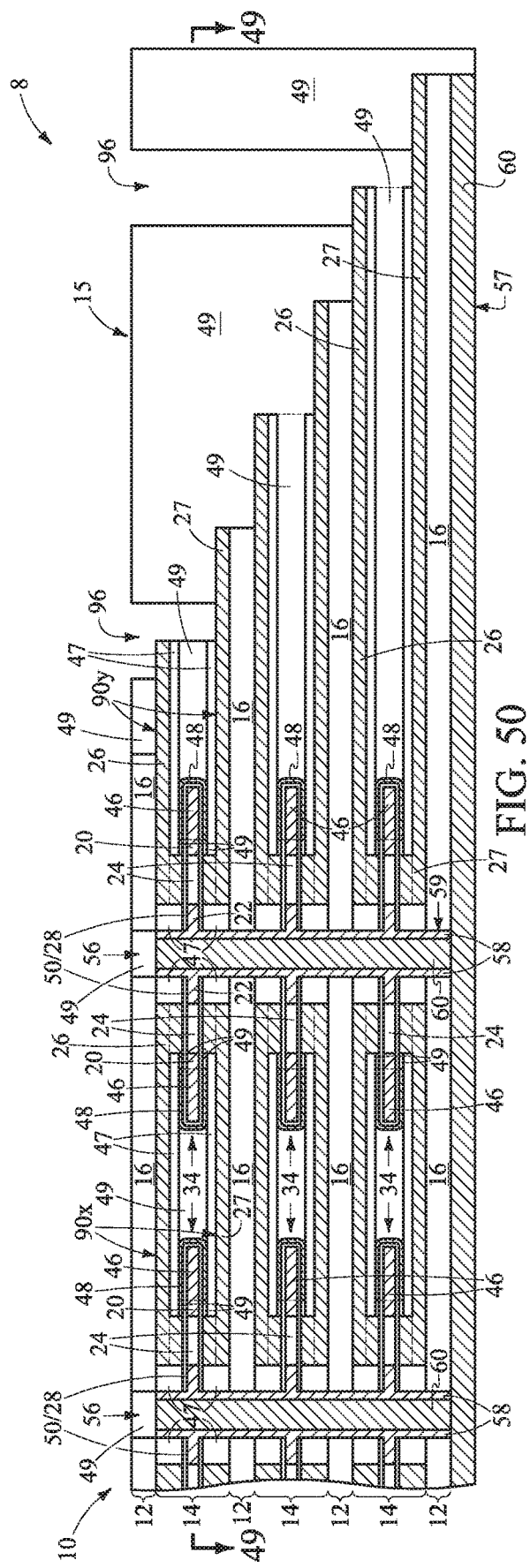

MEMORY ARRAYS

RELATED PATENT DATA

This patent resulted from a provisional application of U.S. Patent Application Ser. No. 62/502,999, filed May 8, 2017, entitled "Memory Arrays", naming Martin C. Roberts, Sanh D. Tang and Fred D. Fishburn as inventors, the disclosures of which are incorporated by reference.

TECHNICAL FIELD

Embodiments disclosed herein pertain to memory arrays.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Programmable materials other than ferroelectric materials may be used as a capacitor insulator to render capacitors non-volatile.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example reversibly programmable charge storage/trap regions as part of the gate construction between the gate insulator and the conductive gate.

One type of transistor is a ferroelectric field effect transistor (FeFET) wherein at least some portion of the gate construction (e.g., the gate insulator) comprises ferroelectric material. The two different polarized states of the ferroelectric material in field effect transistors may be characterized by different threshold voltage ($V_t$) for the transistor or by different channel conductivity for a selected operating voltage. Again, polarization state of the ferroelectric material can be changed by application of suitable programming voltages, and which results in one of high channel conductance or low channel conductance. The high and low conductance, invoked by the ferroelectric polarization state, remains after removal of the gate programming voltage (at least for a time). The status of the channel can be read by applying a small drain voltage which does not disturb the ferroelectric polarization. Programmable materials other than ferroelectric materials may be used as a gate insulator to render a transistor to be non-volatile.

BRIEF DESCRIPTION OF THE DRAWINGS

FIG. 6 is a diagrammatic sectional view of another substrate fragment comprising a memory array in accordance with an embodiment of the invention.

FIG. 7 is a diagrammatic sectional view of another substrate fragment comprising a memory array in accordance with an embodiment of the invention.

FIG. 8 is a diagrammatic sectional view of another substrate fragment comprising a memory array in accordance with an embodiment of the invention.

FIG. 9 is a diagrammatic sectional view of another substrate fragment comprising a memory array in accordance with an embodiment of the invention.

FIG. 10 is a diagrammatic sectional view of another substrate fragment comprising a memory array in accordance with an embodiment of the invention, and is taken through line 10-10 in FIGS. 11 and 12.

FIG. 11 is a sectional view taken through line 11-11 in FIG. 10, and at a larger scale than FIG. 10.

FIG. 12 is a sectional view taken through line 12-12 in FIG. 10, and is at the same larger scale as FIG. 11.

FIG. 15 is a sectional view of the FIG. 13 substrate at a processing step subsequent to that shown by FIG. 13, and is taken through line 15-15 in FIG. 16.

FIG. 16 is a sectional view taken through line 16-16 in FIG. 15, and is at the same larger scale as FIG. 14.

FIG. 27 is a sectional view of the FIG. 25 substrate at a processing step subsequent to that shown by FIG. 25, and is taken through line 27-27 in FIG. 28.

FIG. 28 is a sectional view taken through line 28-28 in FIG. 27, and is at the same larger scale as FIG. 14.

FIG. 29 is a sectional view of the substrate as shown in FIG. 28 at a processing step subsequent to that shown by FIG. 28, and is at the same larger scale as FIG. 14.

FIG. 30 is a sectional view of the FIG. 29 substrate at a processing step subsequent to that shown by FIG. 29, and is at the same larger scale as FIG. 14.

FIG. 31 is a sectional view of the substrate as shown in FIG. 30 at a processing step subsequent to that shown by FIG. 30, is taken through line 31-31 in FIG. 32, and is at the same scale as FIG. 13.

FIG. 32 is a sectional view taken through line 32-32 in FIG. 31, and is at the same larger scale as FIG. 14.

FIG. 33 is a sectional view of the FIG. 31 substrate at a processing step subsequent to that shown by FIG. 31, and is taken through line 33-33 in FIG. 34.

FIG. 34 is a sectional view taken through line 34-34 in FIG. 33, and is at the same larger scale as FIG. 14.

FIG. 35 is a sectional view of the FIG. 33 substrate at a processing step subsequent to that shown by FIG. 33, and is taken through line 35-35 in FIG. 36.

FIG. 36 is a sectional view taken through line 36-36 in FIG. 35, and is at the same larger scale as FIG. 14.

FIG. 37 is a sectional view of the FIG. 35 substrate at a processing step subsequent to that shown by FIG. 35, and is taken through line 37-37 in FIG. 38.

FIG. 38 is a sectional view taken through line 38-38 in FIG. 37, and is at the same larger scale as FIG. 14.

FIG. 41 is a sectional view of the FIG. 39 substrate at a processing step subsequent to that shown by FIG. 39, and is taken through line 41-41 in FIG. 42.

FIG. 42 is a sectional view taken through line 42-42 in FIG. 41, and is at the same larger scale as FIG. 14.

FIG. 43 is a sectional view of the FIG. 41 substrate at a processing step subsequent to that shown by FIG. 41, and is taken through line 43-43 in FIG. 44.

FIG. 44 is a sectional view taken through line 44-44 in FIG. 43, and is at the same larger scale as FIG. 14.

FIG. 47 is a sectional view of the FIG. 45 substrate at a processing step subsequent to that shown by FIG. 45, and is taken through line 47-47 in FIG. 48.

FIG. 48 is a sectional view taken through line 48-48 in FIG. 47, and is at the same larger scale as FIG. 14.

FIG. 49 is a sectional view of the FIG. 47 substrate at a processing step subsequent to that shown by FIG. 47, and is taken through line 49-49 in FIG. 50.

FIG. 50 is a sectional view taken through line 50-50 in FIG. 49, and is at the same larger scale as FIG. 14.

DETAILED DESCRIPTION OF EXAMPLE EMBODIMENTS

Embodiments of the invention encompass memory arrays. A first example embodiment is shown in and described with references to FIGS. 1-5. Such includes a substrate structure or construction 8 comprising a memory array 10 fabricated relative to a base substrate 11. Substrate 11 may comprise any one or more of conductive/conductor/conducting (i.e., electrically herein), semiconductive/semiconductor/semiconducting, and insulative/insulator/insulating (i.e., electrically herein) materials. Various materials have been formed elevationally over base substrate 11. Materials may be aside, elevationally inward, or elevationally outward of the FIGS. 1-5—depicted materials. For example, other partially or wholly fabricated components of integrated circuitry may be provided somewhere above, about, or within base substrate 11. Control and/or other peripheral circuitry for operating components within a memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array.

Figure 1:
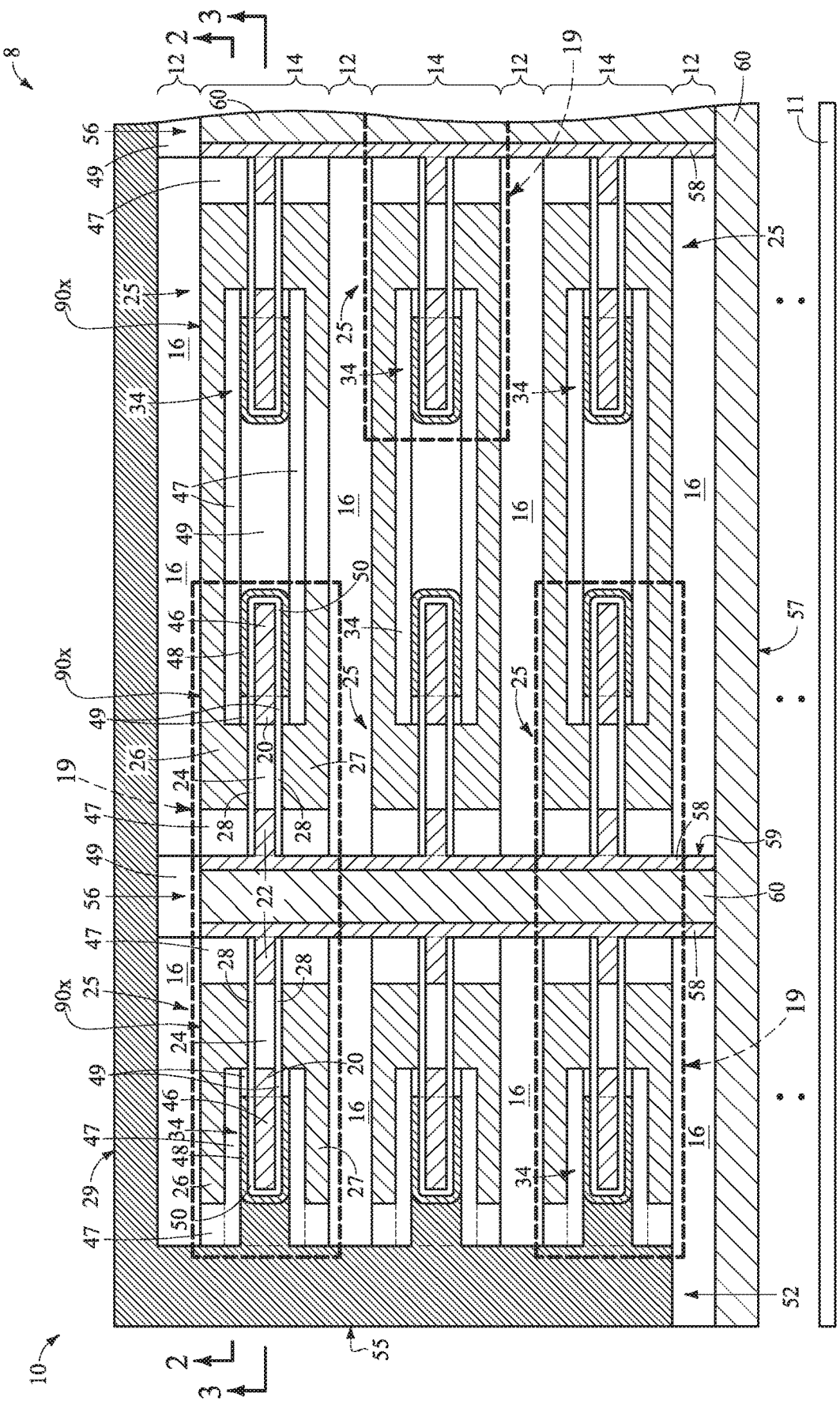
FIG. 1 is a diagrammatic sectional view of a substrate fragment comprising a memory array in accordance with an embodiment of the invention.
Figure 2:
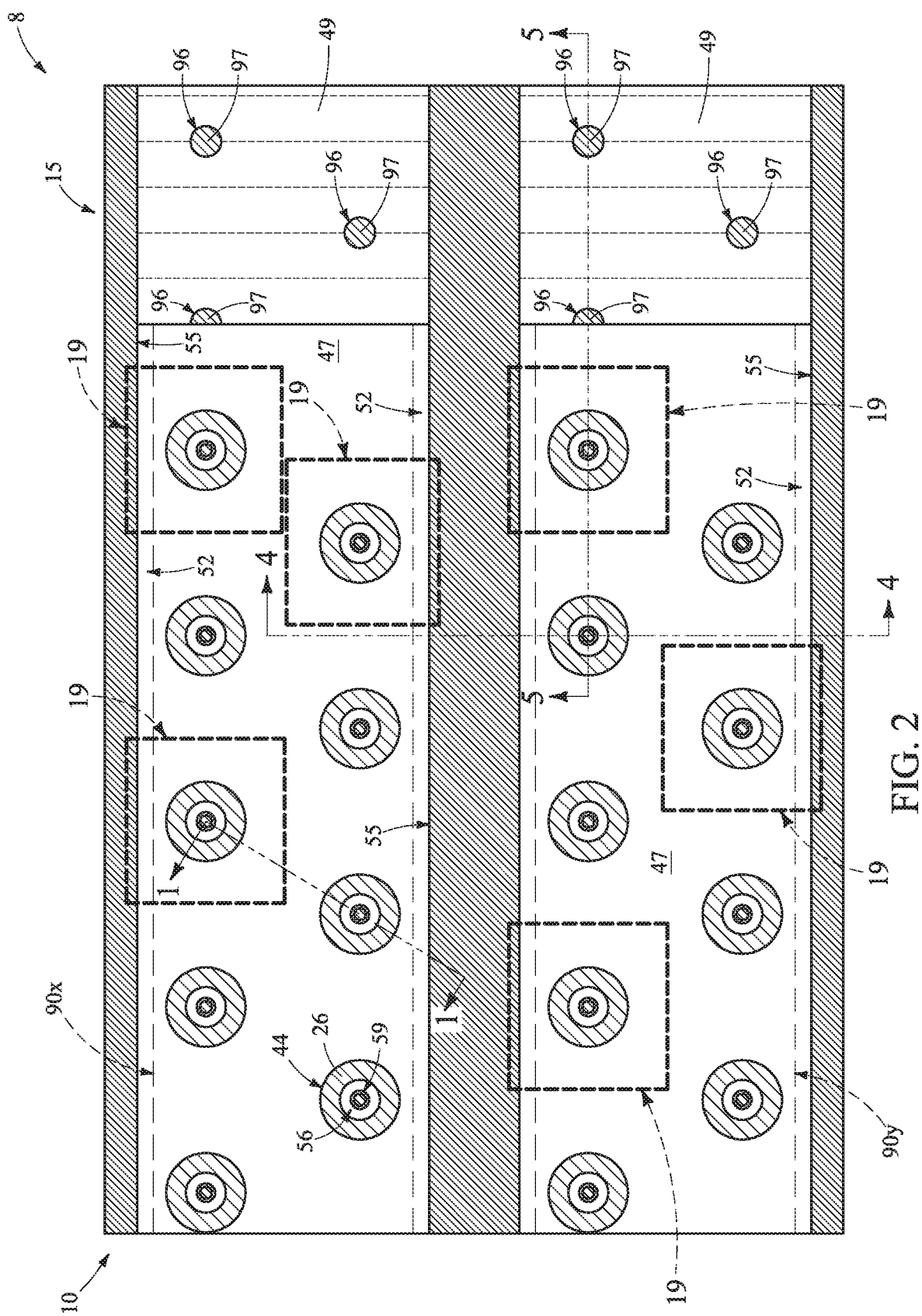
FIG. 2 is a sectional view taken through line 2-2 in FIG. 1, and at a smaller scale than FIG. 1.
Figure 3:
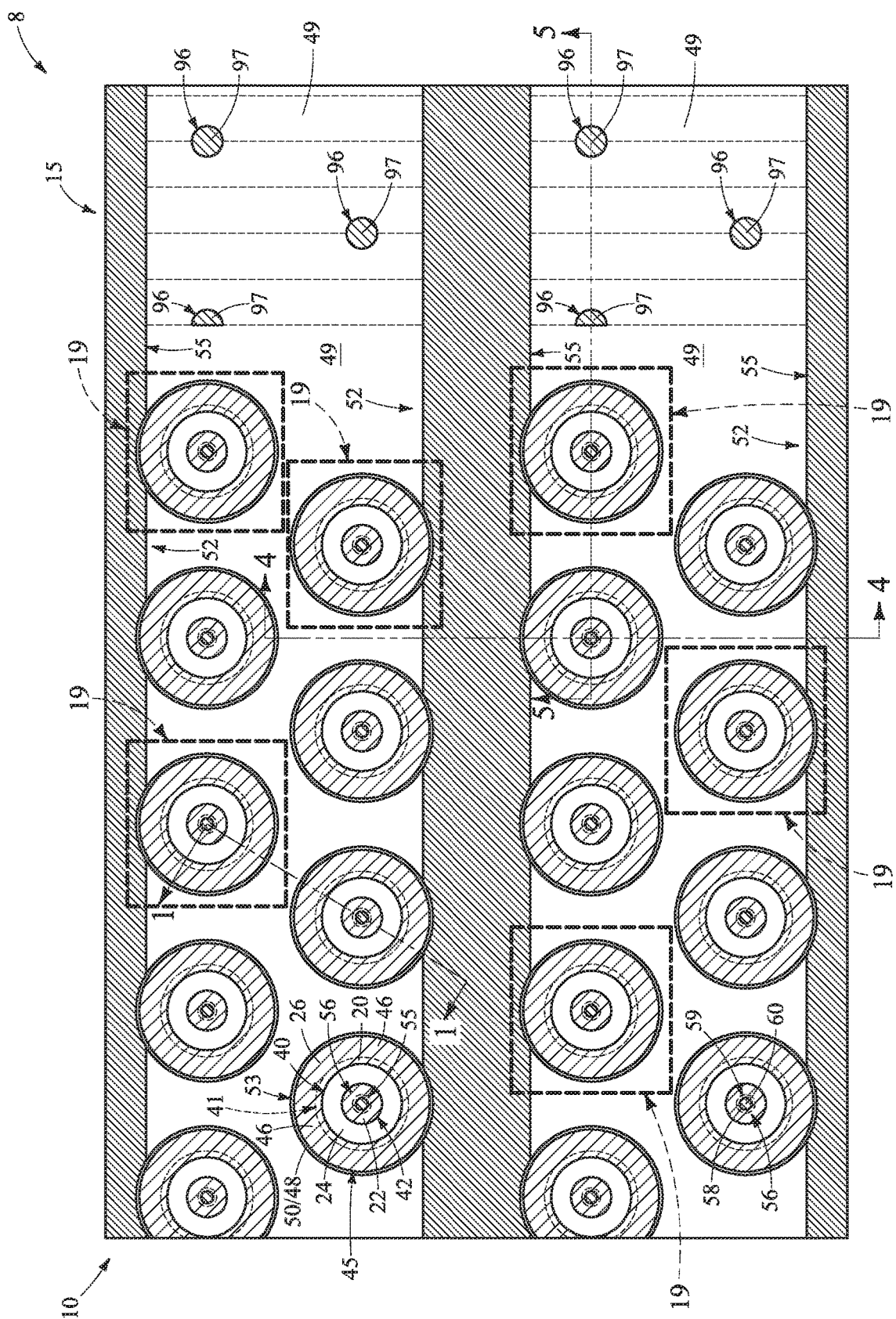
FIG. 3 is a sectional view taken through line 3-3 in FIG. 1, and is at the same smaller scale as FIG. 2.
Figure 4:
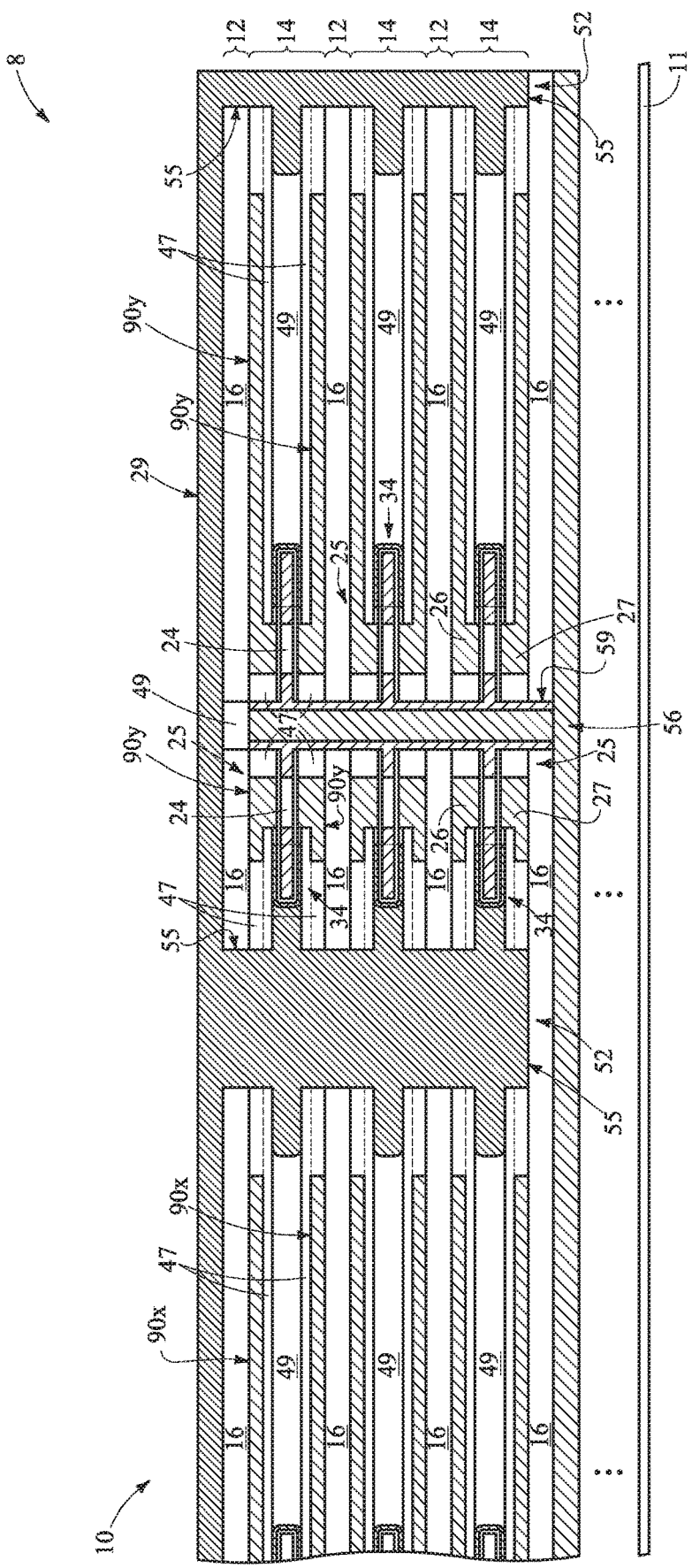
FIG. 4 is a sectional view taken through line 4-4 in FIGS. 2 and 3, and at a smaller scale than FIG. 2.
Figure 5:
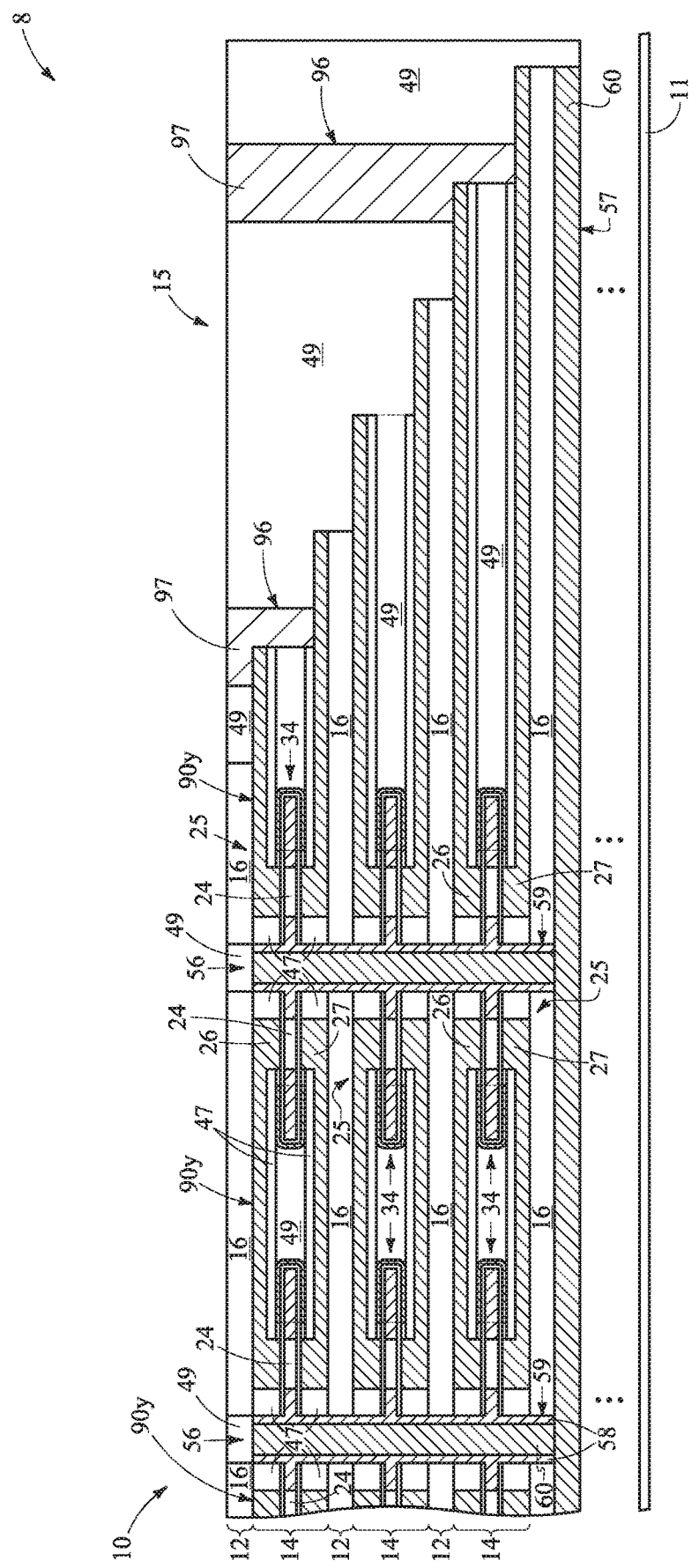
FIG. 5 is a sectional view taken through line 5-5 in FIGS. 2 and 3, and is at the same smaller scale as FIG. 4.

Construction 8 includes vertically-alternating tiers 12 and 14 of insulative material 16 (e.g., comprising, consisting essentially of, or consisting of carbon-doped silicon nitride [2 to 10 atomic percent carbon], silicon nitride, and/or doped or undoped silicon dioxide deposited to a thickness of 200 Angstroms to 500 Angstroms) and memory cells 19, respectively. Only three memory cell outlines 19 are shown in FIG. 1 for clarity, although three complete and three partial memory cells are visible in FIG. 1. Analogously, only six memory cell outlines 19 are shown in FIGS. 2 and 3, although more memory cells are visible in FIGS. 2 and 3. Memory cell tiers 14 may be of the same or different thickness as that of insulative material tiers 12, with different and greater thickness being shown (e.g., 500 Angstroms to 2,000 Angstroms). Construction 8 is shown as having seven vertically-alternating tiers 12 and 14, although fewer or likely many more (e.g., dozens, hundreds, etc.) may be formed. Accordingly, more tiers 12 and 14 may be below the depicted tiers and above base substrate 11 and/or more tiers 12 and 14 may be above the depicted tiers.

Memory cells 19 individually comprise a transistor 25 and a capacitor 34. Transistor 25 comprises a first source/drain region 20 and a second source/drain region 22 (e.g., conductively-doped semiconductor material such as polysilicon for each) having a channel region 24 there-between (e.g., doped semiconductor material, such as polysilicon, but not to be intrinsically conductive). In some embodiments (but not shown), a conductively-doped semiconductor region and/or or an electrically semiconductive region (e.g., LDD and/or halo regions) may be between channel region 24 and one or both of source/drain regions 20 and 22.

A gate 26 or 27 (e.g., one or more of elemental metal, a mixture or alloy of two or more elementals, conductive metal compounds, and conductively-doped semiconductive materials) is operatively proximate channel region 24. Specifically, in the depicted example, a gate insulator material 28 (e.g., silicon dioxide, silicon nitride, hafnium oxide, other high k insulator material, and/or ferroelectric material) is between gate 26/27 and channel region 24. In one embodiment and as shown, individual memory cell tiers 14 comprise gate 26 and another gate 27, with one of such gates (e.g., gate 26) being directly above the other (e.g., gate 27) in that individual memory cell tier 14. At least a portion of channel region 24 is horizontally-oriented for horizontal current flow in the portion between first source/drain region 20 and second source/drain region 22. In the depicted example embodiment, all of channel region 24 is horizontally-oriented for horizontal current flow there-through. Regardless, when suitable voltage is applied to gate 26 and/or 27, a conductive channel can form within channel region 24 proximate gate insulator material 28 such that current is capable of flowing between source/drain regions 20 and 22.

In one embodiment and as shown, channel region 24 comprises an annulus 40 in a straight-line horizontal cross-section (e.g., the cross-section shown by FIG. 3). In one embodiment and as shown, gate 26 comprises an annulus 44 in a straight-line horizontal cross-section. (e.g., the cross-section shown by FIG. 2). In one embodiment and as shown, first source/drain region 20 comprises an annulus 41 in a straight-line horizontal cross-section (e.g., the cross-section shown by FIG. 3). In one embodiment and as shown, second source/drain region 22 comprises an annulus 42 in a straight-line horizontal cross-section (e.g., the cross-section shown by FIG. 3).

One or both of gates 26 and 27 may be part of an access line (e.g., two access lines 90x and 90y being shown) interconnecting multiple transistors along a row or a column. Regardless, in one embodiment that includes both of gates 26 and 27, such gates are directly electrically coupled to one. As examples, and by way of examples only, one or more staircase regions 15 (one being shown in FIGS. 2, 3, and 5) may be provided at an end of or as a part of array 10. Staircase region 15 as shown comprises staggered contact openings 96 individually having a conductive via 97 (e.g., metal material) therein that directly electrically couples together vertically-stacked gates 26 and 27 in individual memory cell tiers 14. Conductive vias 97 may connect with a respective conductive control and/or access line (not shown) to separately access gate line pairs 26, 27 in each memory cell tier 14.

Capacitor 34 comprises a first electrode 46 and a second electrode 48 (e.g., conductively-doped semiconductive material and/or metal material for each) having a capacitor insulator 50 there-between (e.g., silicon dioxide, silicon nitride, hafnium oxide, other high k insulator material, and/or ferroelectric material). Second capacitor electrode material 48 and capacitor insulator 50 are not separately distinguishable in FIG. 3 due to scale. First electrode 46 is electrically coupled, in one embodiment directly electrically coupled, to first source/drain region 20. Second electrodes 48 of multiple of capacitors 34 in array 10 are electrically coupled, in one embodiment are directly electrically coupled, with one another. In one embodiment, all such second electrodes of all capacitors in array 10 are electrically coupled with one another, and in one embodiment are directly electrically coupled with one another. In one embodiment and as shown, second electrode 48 is both directly above and directly below first electrode 46 in a straight-line vertical cross-section (e.g., the cross-section depicted by FIG. 1). In one embodiment and as shown, first electrode 46 comprises an annulus 45 in a straight-line horizontal cross-section (e.g., the cross-section shown by FIG. 3), and in one embodiment second electrode 48 comprises an annulus 53 in a straight-line horizontal cross-section (e.g., the cross-section shown by FIG. 3). In one embodiment and as shown, one gate 26 or 27 (e.g., 26) extends longitudinally directly above capacitor 34 in a straight-line vertical cross-section (e.g., the cross-section shown by FIG. 1), and in one embodiment other gate 26 or 27 (e.g., 27) extends longitudinally directly under capacitor 34 in a straight-line vertical cross-section (e.g., the cross-section shown by FIG. 1).

In one embodiment, a capacitor-electrode structure 52 (e.g., a solid or hollow pillar, a solid or hollow wall, etc.) extends elevationally through vertically-alternating tiers 12 and 14, with individual of second electrodes 48 of individual capacitors 34 that are in different memory cell tiers 14 being electrically coupled, in one embodiment directly electrically coupled, to elevationally-extending capacitor-electrode structure 52. Example materials for capacitor-electrode structure 52 are metal materials and conductively-doped semiconductor material. In one embodiment and as shown, capacitor-electrode structure 52 extends vertically or within 10° of vertical. In one embodiment and as shown, capacitor-electrode structure 52 comprises an elevationally-extending wall 55 that is longitudinally-elongated horizontally and that directly electrically couples the individual second capacitor together. In one embodiment, such, by way of example only, is one example of how second capacitor electrodes 48 of multiple of capacitors 34 that are in different memory cell tiers 14 in the array may be electrically coupled with one another. In one embodiment, capacitor-electrode structure 52 is directly electrically coupled to a horizontally-elongated capacitor-electrode construction 29 (e.g., a line or a plate) that is above or below (above being shown) vertically-alternating tiers 12 and 14. Construction(s) 29 may, in one embodiment, directly electrically couple together all second electrodes 48 within the array.

A sense line is electrically coupled, in one embodiment directly electrically coupled, to multiple of the second source/drain regions of individual of the transistors that are in different memory cell tiers. In one embodiment and as shown, a sense-line structure 56 (e.g., a solid or hollow pillar, a solid or hollow wall, etc.) extends elevationally through vertically-alternating tiers 12 and 14, with individual of second source/drain regions 22 of individual transistors 25 that are in different memory cell tiers 14 being electrically coupled, in one embodiment directly electrically coupled, thereto. In one embodiment and as shown, sense-line structure 56 extends vertically or within 10° of vertical. In one embodiment and as shown, sense-line structure 56 comprises a pillar 59. In one embodiment and as shown, sense-line structure 56 comprises a peripheral conductively-doped semiconductive material 58 (e.g., poly silicon) and a central metal material core 60 (e.g., titanium nitride and/or tungsten). In one embodiment, sense-line structure 56 is directly electrically coupled to a horizontal longitudinally-elongated sense line 57 that is above or below (below being shown) vertically-alternating tiers 12 and 14.

Example insulator material 47 (e.g., silicon nitride) and insulator material 49 (e.g., silicon dioxide) may be provided as shown for suitable isolation in sub-tiers of memory cell tiers 14.

An alternate embodiment construction 8a of a memory array 10 is shown in FIG. 6. Like numerals from the above-described embodiments have been used where appropriate, with some construction differences being indicated with the suffix "a". Only one tier 14a and two tiers 12 are shown for clarity. The channel region of transistor 25a comprises two channel-region segments 24a that are spaced elevationally apart from one another in a straight-line vertical cross-section (e.g., the cross-section shown by FIG. 1). In one such embodiment, such two channel-region segments 24a are directly electrically coupled to one another, and in one such embodiment as shown are so coupled by first source/drain region 20a. In one embodiment and as shown, second electrode 48a of capacitor 34a is not both directly above and directly below first electrode 46a in any straight-line vertical cross-section. In one embodiment and as shown, first electrode 46a is both directly above and directly below second electrode 48a in a straight-line vertical cross-section (e.g., the cross-section shown by FIG. 1). Any other attribute(s) or aspect(s) as shown and/or described herein with respect to other embodiments may be used.

FIG. 7 shows another example alternate embodiment construction 8b of a memory array 10, with individual memory cells comprising a transistor 25b and a capacitor 34b. Like numerals from the above-described embodiments have been used where appropriate, with some construction differences being indicated with the suffix "b". Again, only one tier 14b and two tiers 12 are shown. Transistor 25b comprises only a single gate 26 (e.g., no additional gate 27) associated with channel region 24. Such is shown as being above channel region 24, although such may alternately be there-below. Accordingly, capacitor 34b may be considered as being single-sided whereas capacitors 34 and 34a may be considered as being at least double-sided (e.g., top and bottom sided with respect to capacitor electrode 48, 48a). Any other attribute(s) or aspect(s) as shown and/or described herein with respect to other embodiments may be used.

In one embodiment, individual of the memory cell tiers have no two of the memory cells that are directly above and directly below one another in that individual memory cell tier. For example, and by way of example only, the above described embodiments with respect to FIGS. 1-7 show such example embodiments. Alternately, and by way of example only, individual of the memory cell tiers may comprise two of the memory cells where one of which is directly above the other in that individual tier of memory cells. A first example such embodiment is shown and described with respect to FIG. 8 and a construction 8c of a memory array 10. Like numerals from the above-described embodiments have been used where appropriate, with some construction differences being indicated with the suffix "c". Again, only one tier 14c and two tiers 12 are shown.

Individual memory cells 19 in a single tier 14c are shown as comprising a transistor 25c and a capacitor 34c. One of memory cells 19 is above another memory cell 19 in an individual tier 14c as shown in the example embodiment. In one embodiment as shown, each capacitor 34c shares a capacitor electrode 48c that extends to or is part of capacitor-electrode structure 52. Second source/drain regions 22 of the depicted different transistors 25c may be electrically coupled, in one embodiment directly electrically coupled, to one another for example as shown by conductive materials 58 and 60 as part of sense-line structure 56. First source/drain regions 20 of each transistor 25c are not directly electrically coupled to one another, and are electrically coupled, in one embodiment directly electrically coupled, with respective first capacitor electrodes 46c. Thereby, two vertically-stacked memory cells 19 (one directly above the other) are formed within a single memory cell tier 14c. Transistor gates 26 and 27, in one embodiment, are not directly electrically coupled to one another which may enable better separate access/control with respect to different transistors 25c that are above and below one another within an individual memory cell tier 14c. Any other attribute(s) or aspect(s) as shown and/or described herein with respect to other embodiments may be used.

A second example such embodiment is shown and described with respect to FIG. 9 and a construction 8d of a memory array 10. Like numerals from the above-described embodiments have been used where appropriate, with some construction differences being indicated with the suffix "d". Again, only one tier 14d and two tiers 12 are shown. Example construction 8d is very similar to construction 8c, with each memory cell 19 having a transistor 25d and capacitor 34c. Transistor 25d differs from transistor 25c in having second source/drain regions 22d that integrally connect with one another elevationally along and aside sense-line structure 56. Still, individual memory cell tiers 14d comprise two of memory cells 19 where one of such is directly above the other in that individual tier of memory cells.

In one embodiment that includes both of gates 26 and 27, such gates are not directly coupled to one another. For example, such an embodiment is shown and described with respect to FIGS. 10-12 and a construction 8e of a memory array. Like numerals from the above-described embodiments have been used where appropriate, with some construction differences being indicated with the suffix "e". Staircase region 15e comprises staggered contact openings 96e individually having a conductive via 97e therein that separately extend to different individual gates 26 and 27 in individual memory cell tiers 14, thereby not directly coupling together gates 26 and 27 in individual memory cell tiers 14.

The above example structures may be manufactured by any existing or yet-to-be-developed techniques. One example technique of manufacturing the embodiment shown by FIGS. 1-5 is described with reference to FIGS. 13-52. Like numerals from the above-described embodiments have been used for predecessor construction(s), regions, and like/predecessor materials thereof.

Figure 13:
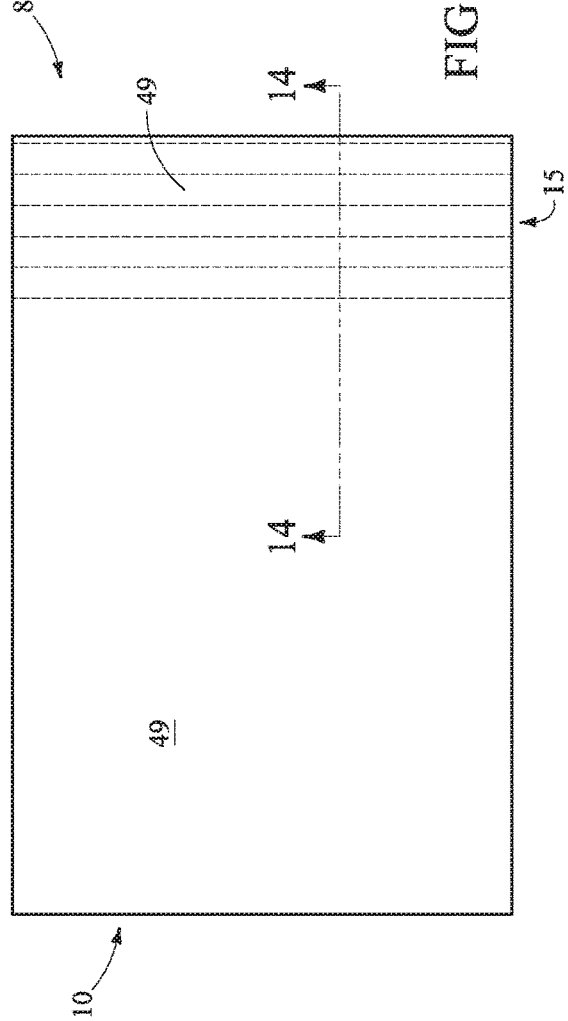
FIG. 13 is a diagrammatic perspective view of a predecessor substrate to that shown by FIGS. 1-5, and is taken through line 13-13 in FIG. 14.
Figure 14:
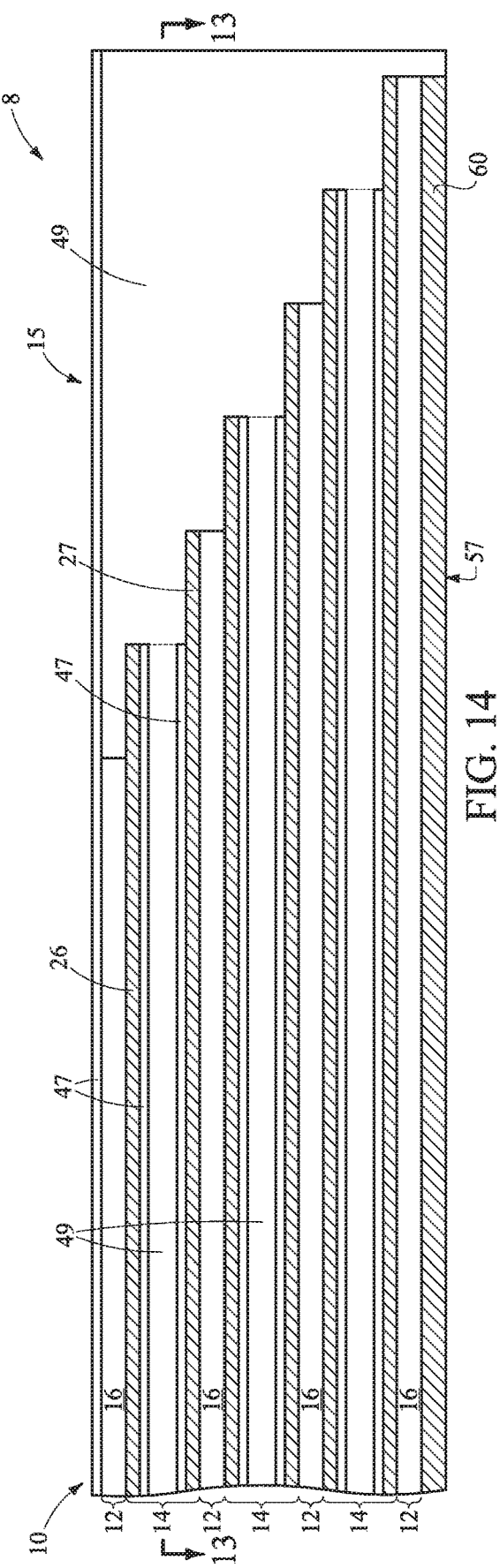
FIG. 14 is a sectional view taken through line 14-14 in FIG. 13, and is at a larger scale than FIG. 13.

FIGS. 13 and 14 show an example portion of a predecessor to the construction or stack of FIGS. 1-5. The person of skill in the art may select any suitable different combinations of materials recognizing, in accordance with the continuing description, that certain materials will be etched selectively relative to other materials in the example method. As examples, and consistent with those described above, example material 16 for insulative-material tiers 12 is carbon-doped silicon nitride (2 to 10 atomic percent carbon). An example thickness for insulative material 16 is 200 to 500 Angstroms. Construction 8 includes a stack of materials or layers 26, 47, 49, 47, and 27 (top-to-bottom), and each of which may be considered as a sub-tier within what will be memory cell tiers 14. Example thickness for each of materials 26, 47, and 27 is 100 to 400 Angstroms, with example gate materials 26 and 27 being n+ conductively-doped polysilicon. An example insulator material 47 is silicon nitride. Materials 26 and/or 27 may be sacrificial and replaced by conductively-doped semiconductive material and/or metal material. An example insulator material 49 is silicon dioxide, with an example thickness being 300 to 600 Angstroms. Construction 8 has been patterned to form staircase region 15 whereby individual gate materials 26 and 27 in individual memory cell tiers 14 form uppermost surfaces of so-called "stairs" that may subsequently be upwardly-exposed as will become apparent from the continuing discussion. Example silicon-dioxide-insulator material 49 is atop the stairs in staircase region 15.

Referring to FIGS. 15 and 16, openings 33 have been formed in and through the depicted stack of materials in an offset or staggered manner. The centers of example openings 33 are centered relative to what will be the centers of sense-line structures 56 (not shown) and annuli 40, 41, 42, and 44 (not shown).

Figure 17:
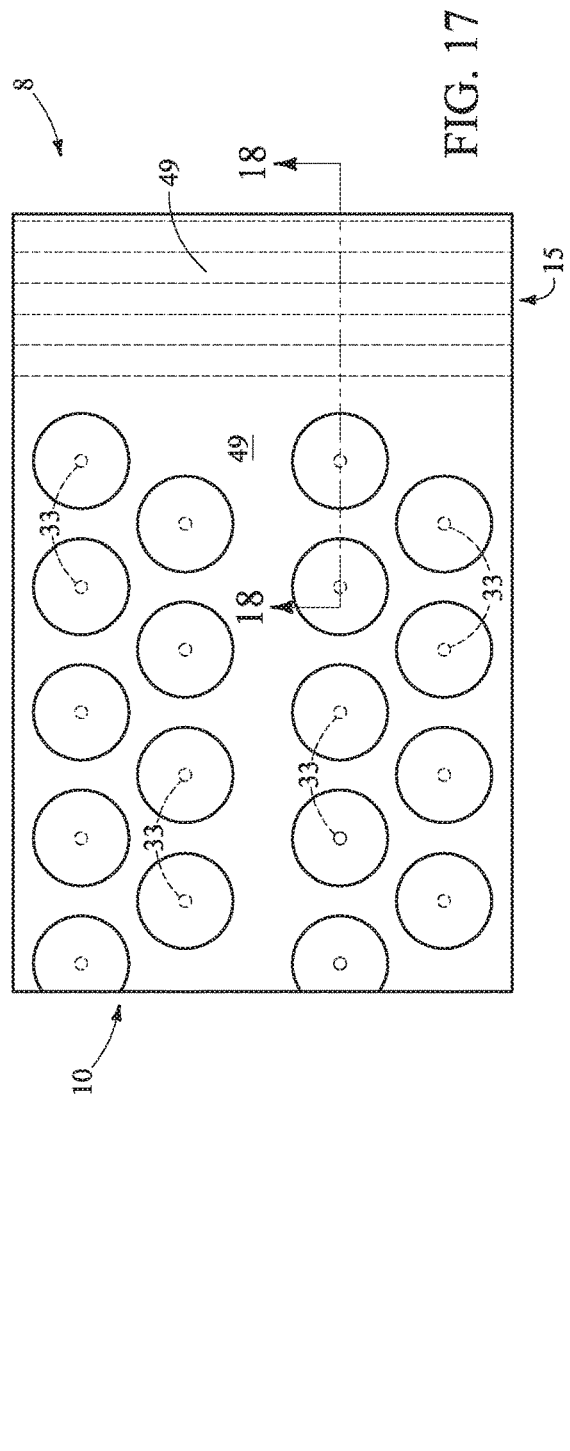
FIG. 17 is a sectional view of the FIG. 15 substrate at a processing step subsequent to that shown by FIG. 15, and is taken through line 17-17 in FIG. 18.
Figure 18:
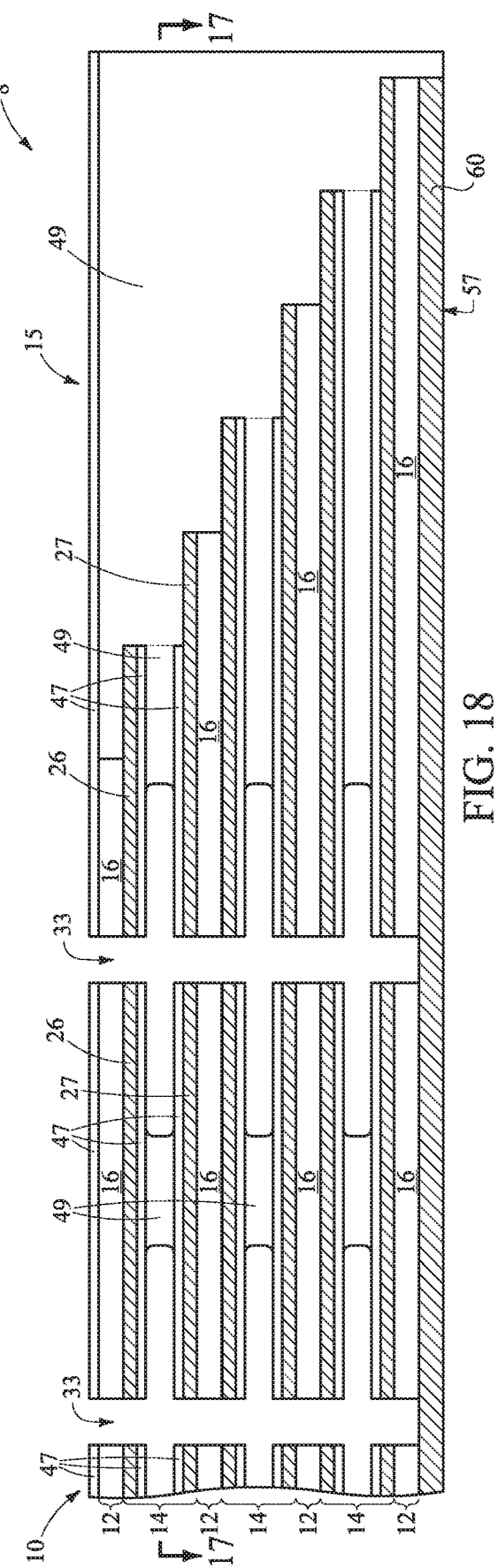
FIG. 18 is a sectional view taken through line 18-18 in FIG. 17, and is at the same larger scale as FIG. 14.

Referring to FIGS. 17 and 18, substrate construction 8 of FIGS. 15 and 16 has been subjected to suitable etching whereby material 49 has been etched laterally/radially selectively relative to the other depicted materials effective to widen openings 33 within memory cell tiers 14. With respect to the above example materials, an example etching chemistry is dilute HF. An example uppermost silicon nitride insulator layer 47 protects example silicon-dioxide-insulator material 49 there-under from being etched in staircase region 15.

Figure 19:
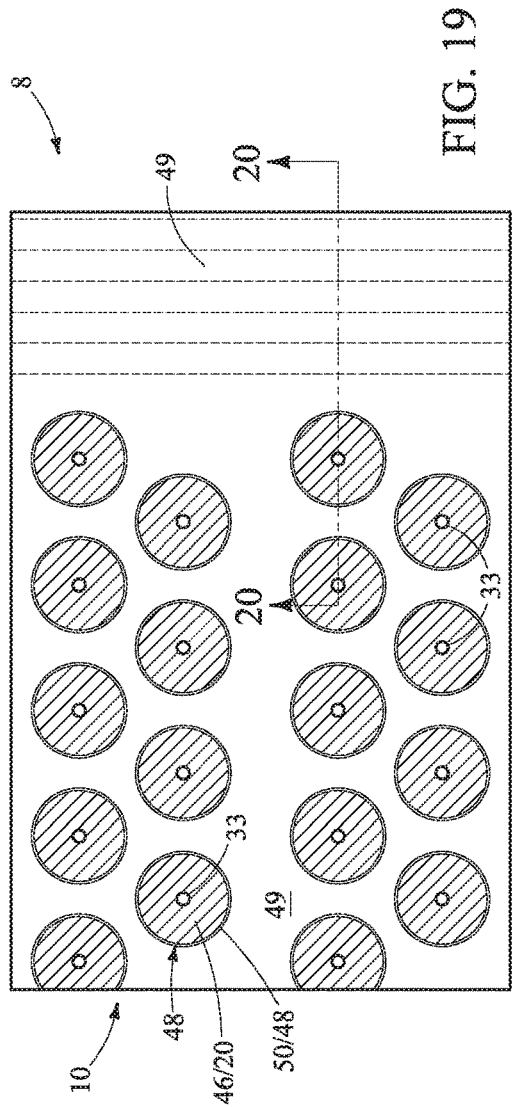
FIG. 19 is a sectional view of the FIG. 17 substrate at a processing step subsequent to that shown by FIG. 17, and is taken through line 19-19 in FIG. 20.
Figure 20:
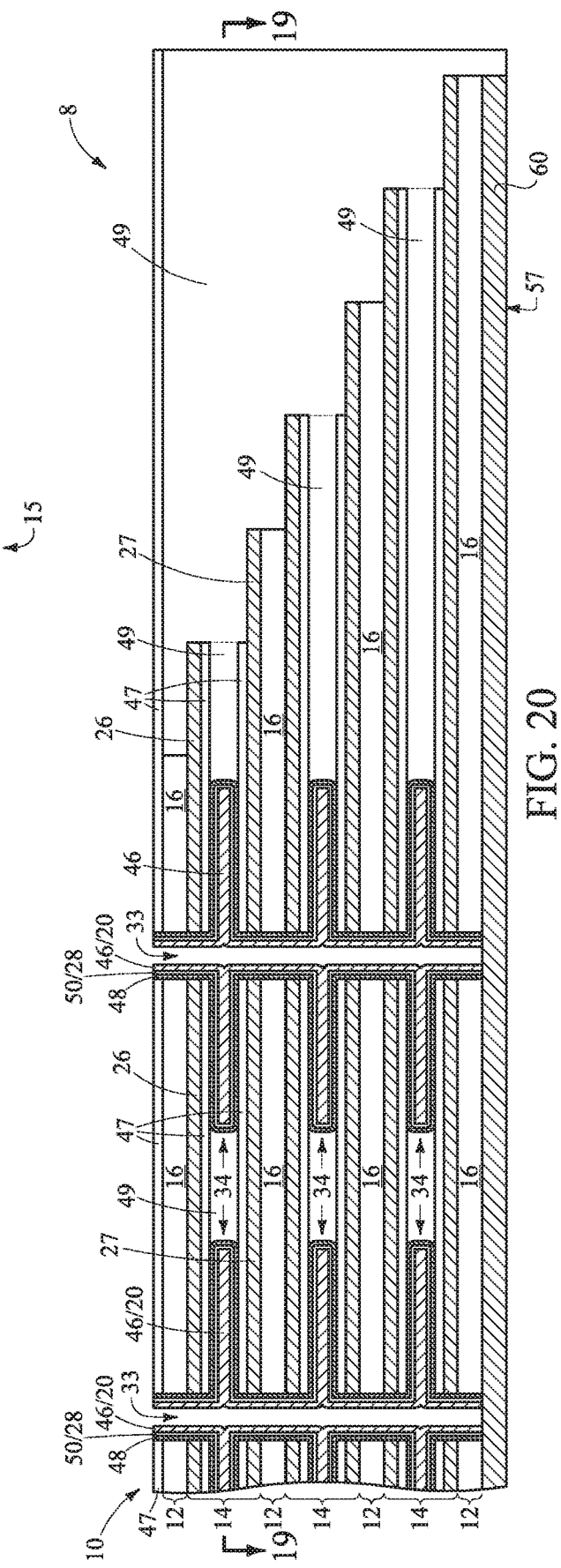
FIG. 20 is a sectional view taken through line 20-20 in FIG. 19, and is at the same larger scale as FIG. 14.

Referring to FIGS. 19 and 20, second capacitor electrode material 48 (e.g., titanium nitride at 30 to 60 Angstroms), capacitor insulator 50/gate insulator 28 (e.g., silicon dioxide and/or a high k insulator at 30 to 60 Angstroms), and first capacitor electrode material 46—first source/drain material 20 (e.g., conductively-dope polysilicon at 50 to 100 Angstroms) have been deposited as shown. Second capacitor electrode material 48 and capacitor insulator 50/gate insulator 28 are not separately distinguishable in FIG. 19, nor in subsequent corresponding odd-numbered figures, due to scale. Insulator material 50/28 may be silicon dioxide that is subjected to in situ steam generation immediately after its deposition for densification (e.g., at 650° C. to 1000° C., atmospheric or sub-atmospheric pressure, and in the presence of $O_2$ and $H_2$). Material 46/20 has been deposited sufficient to fill the laterally-widened portions of openings 33, but ideally not sufficient to fill the central portion of the narrower part of such openings.

Figure 21:
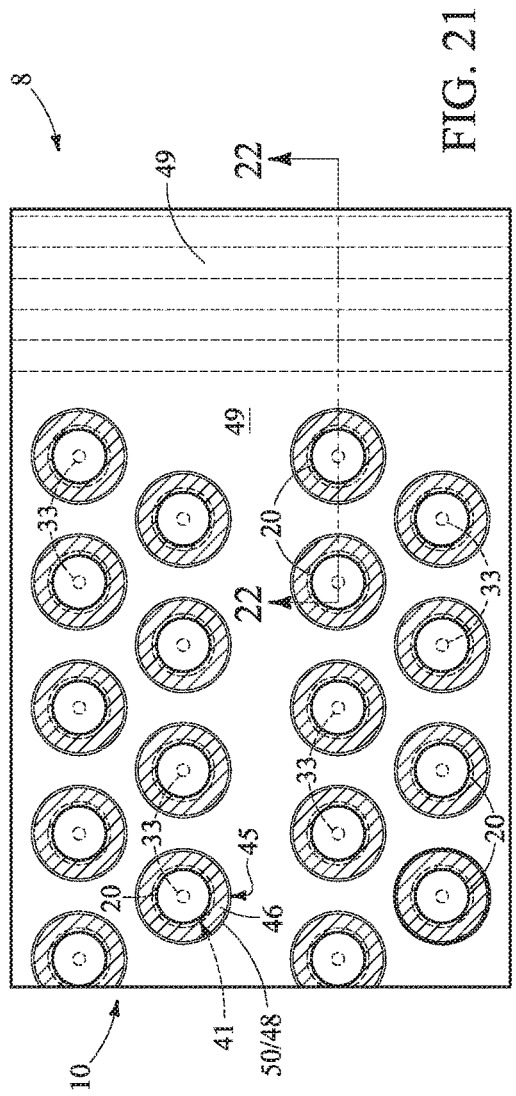
FIG. 21 is a sectional view of the FIG. 19 substrate at a processing step subsequent to that shown by FIG. 19, and is taken through line 21-21 in FIG. 22.
Figure 22:
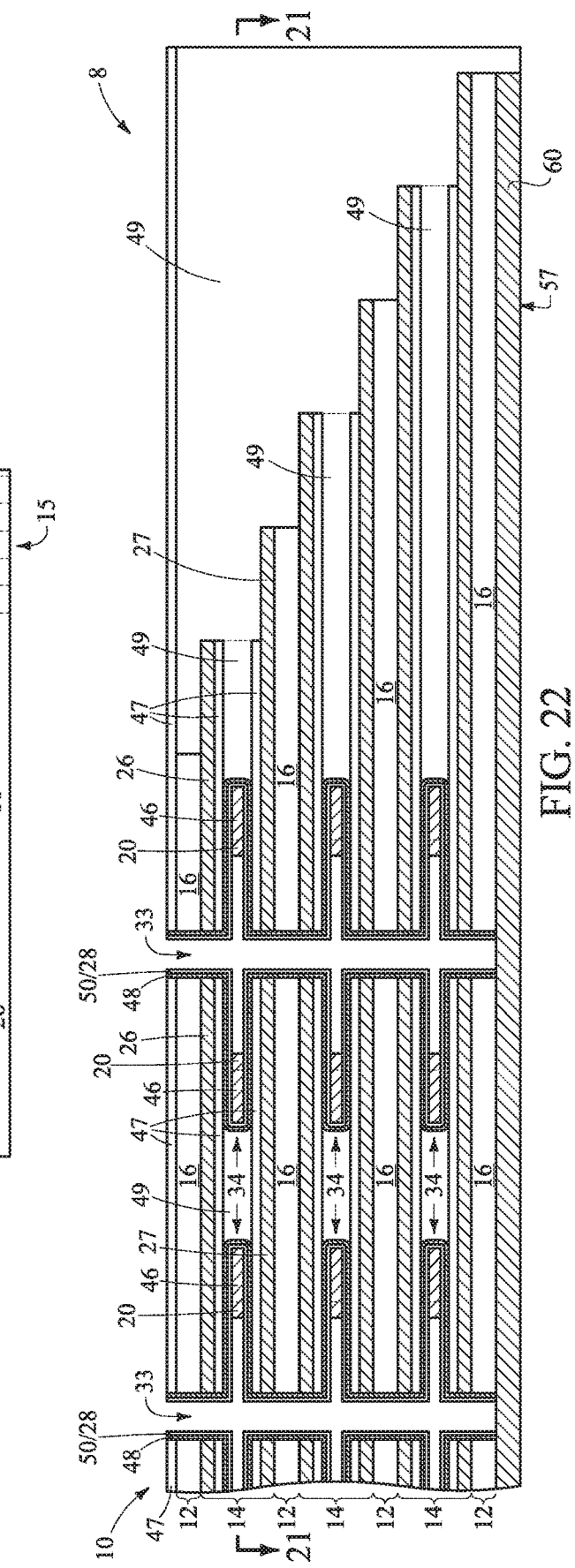
FIG. 22 is a sectional view taken through line 22-22 in FIG. 21, and is at the same larger scale as FIG. 14.

Referring to FIGS. 21 and 22, material 46/20 has been etched as shown to form finished first capacitor electrode 46 and first source/drain region 20 (and corresponding annuli 45 and 41, respectively). An example etching chemistry to conduct the example depicted selective etch for the stated materials is tetra-methylammonium hydroxide (TMAH).

Figure 23:
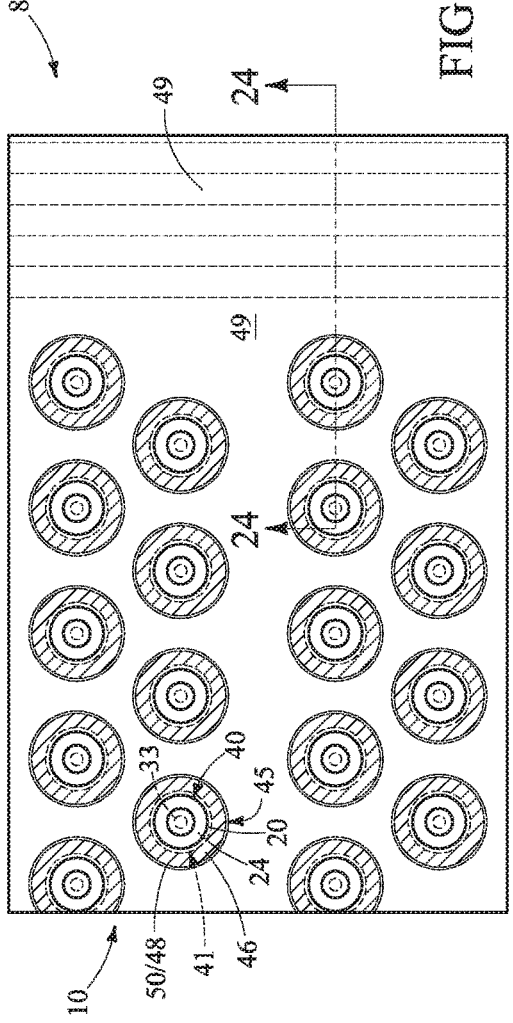
FIG. 23 is a sectional view of the FIG. 21 substrate at a processing step subsequent to that shown by FIG. 21, and is taken through line 23-23 in FIG. 24.
Figure 24:
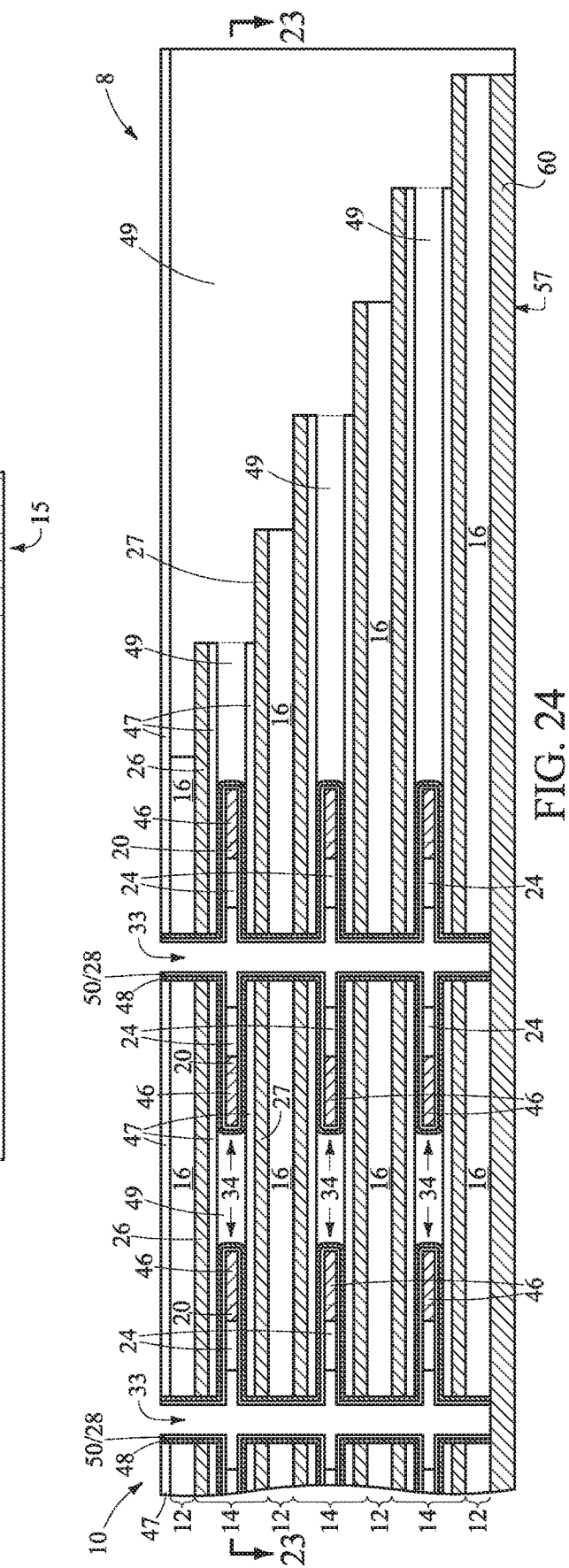
FIG. 24 is a sectional view taken through line 24-24 in FIG. 23, and is at the same larger scale as FIG. 14.

Referring to FIGS. 23 and 24, intrinsic or suitably-doped channel-material silicon 24 has been deposited and subsequently etched back as-shown to set the channel length (e.g., 200 Angstroms) and define channel annuli 40. An example etching chemistry for the stated materials is TMAH.

Figure 25:
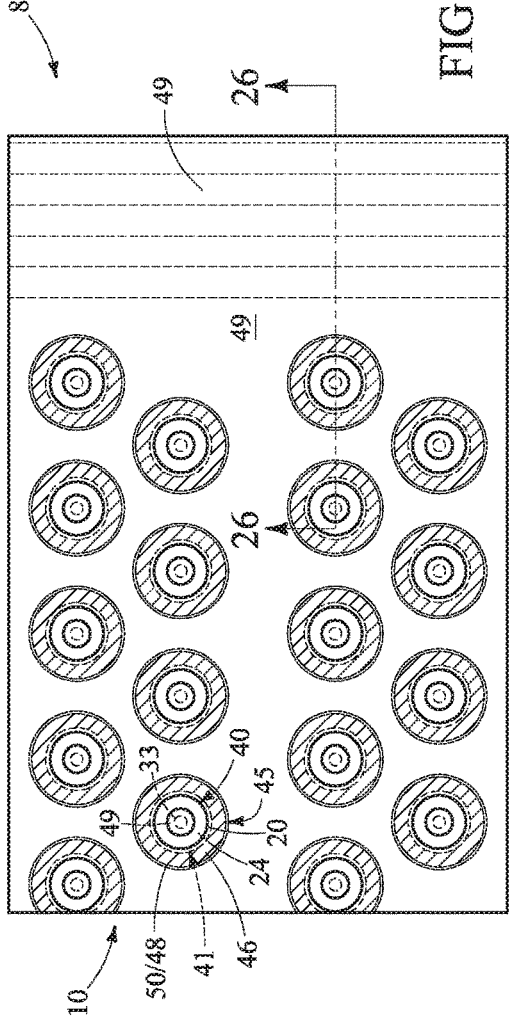
FIG. 25 is a sectional view of the FIG. 23 substrate at a processing step subsequent to that shown by FIG. 23, and is taken through line 25-25 in FIG. 26.
Figure 26:
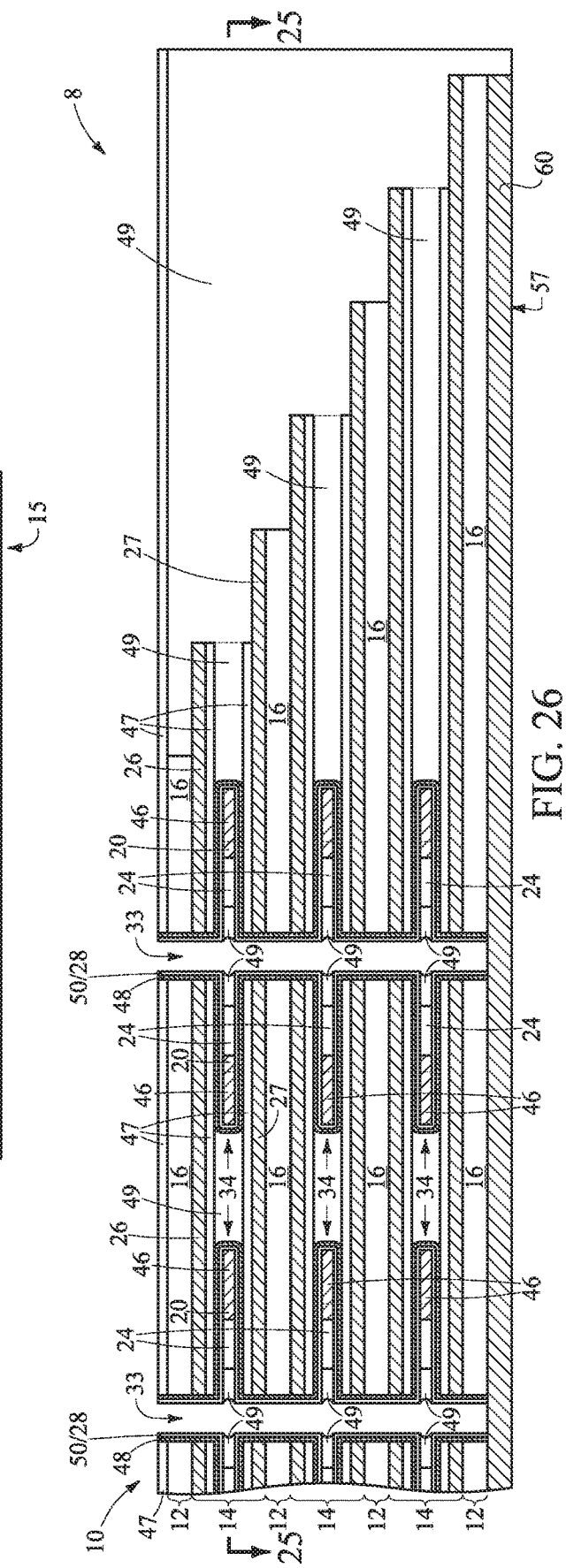
FIG. 26 is a sectional view taken through line 26-26 in FIG. 25, and is at the same larger scale as FIG. 14.

Referring to FIGS. 25 and 26, more silicon-oxide-insulator material 49 has been deposited effective to fill the depicted recesses/gaps that were formed by the etching of channel material 24 shown in in FIGS. 23 and 24, followed by selective etch thereof (e.g., dilute HF) to remove such form the main portion of openings 33.

Referring to FIGS. 27 and 28, insulator material 50/28 has been etched, followed by etching of titanium nitride second capacitor electrode material 48, to remove such from being within the main portion of openings 33. Example etching chemistries include, respectively, dilute HF and a combination of hydrogen peroxide and sulfuric acid. Thereafter, example silicon nitride insulator material 47 has been suitably etched (e.g., using hot phosphoric acid) to remove the uppermost layer 47 and to laterally recess material 47 within memory cell tiers 14 as shown. Such also thereby exposes elevationally uppermost and elevationally lowermost surfaces of second capacitor electrode material 48 where silicon nitride insulator material 47 has been removed in memory cell tiers 14.

Referring to FIG. 29, example titanium nitride material 48 has been subjected to selective etching (e.g., using sulfuric acid and hydrogen peroxide) sufficient to recess it laterally/radially as shown and to form elevational gaps/recesses between insulator material 50/28 and example silicon nitride 47 at radially inner ends (relative to openings 33) of silicon nitride 47.

Referring to FIG. 30, insulator material 49 has been formed within the elevational gaps/recesses that were formed by the etching shown in FIG. 29. An example technique for producing the FIG. 30 construction is a conformal deposition of example silicon-dioxide-insulator material 49, followed by etch back (e.g., using dilute HF) to remove such except where received in the depicted gaps/recesses.

Referring to FIGS. 31 and 32, more example n+ conductively-doped polysilicon gate material 26, 27 has been deposited to fill the remaining gaps/recesses shown in FIG. 30, followed by selective etching of material 26, 27 (e.g., using TMAH) to laterally recess it as shown.

Referring to FIGS. 33 and 34, example silicon-nitride-insulator material 47 has been deposited to fill the gaps that were formed by the etching shown in FIGS. 31 and 32, followed by selective etch thereof (e.g., using hot phosphoric acid) to remove such from being within the main portion of openings 33.

Referring to FIGS. 35 and 36, example silicon-dioxide-insulator material 49 that was formed as described above with respect to FIGS. 25 and 26 (not shown in FIGS. 35 and 36) has been removed by selective etching (e.g., HF). Suring such etching, some silicon-dioxide-insulator material 49 in staircase region 15 may also be etched (not shown). Alternately, uppermost silicon-nitride insulator material 47 (not shown) shown in FIG. 14 may initially be sufficiently thick such that all of it is not removed in the processing shown by FIGS. 27 and 28 such that some of it remains (not shown)

and protects staircase-region-silicon-oxide material 49 during removal of material 49 that was formed as shown in FIGS. 25 and 26.

Referring to FIGS. 37 and 38, second source/drain region material 22/material 58 has been deposited as shown sufficient to fill the gaps formed by removing material 49 as shown in FIGS. 35 and 36. Subsequently, metal material 60 has been deposited and planarized and/or etched back as-shown to form sense-line structures 56. Uppermost portions of materials 58 and 60 have been removed as shown and openings formed thereby have been plugged with insulator material 49.

Figure 39:
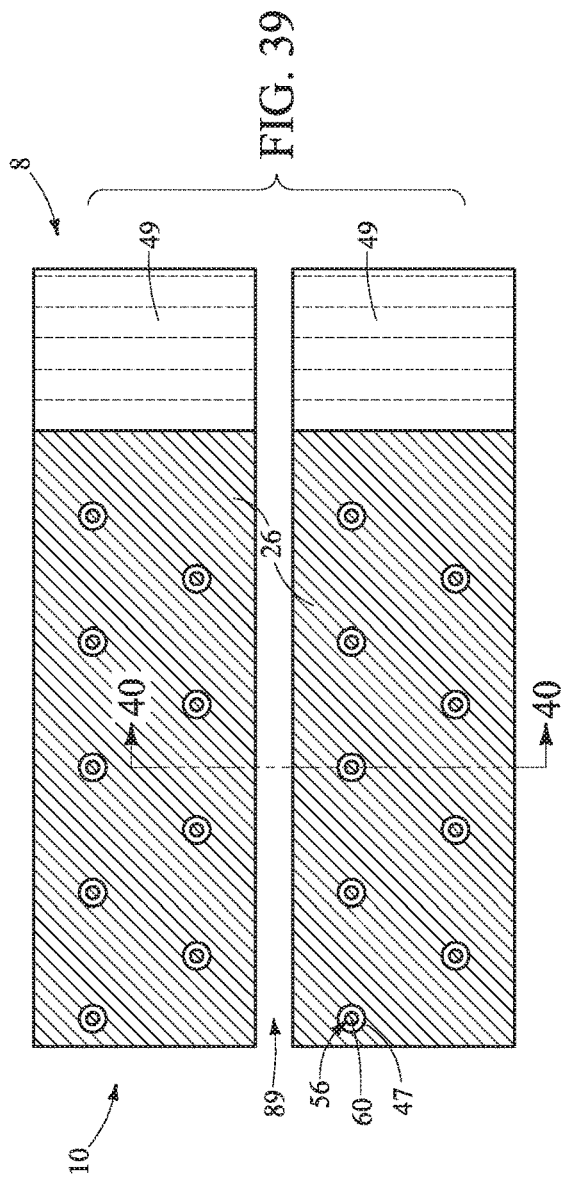
FIG. 39 is a sectional view of the FIG. 37 substrate at a processing step subsequent to that shown by FIG. 37, and is taken through line 39-39 in FIG. 40.
Figure 40:
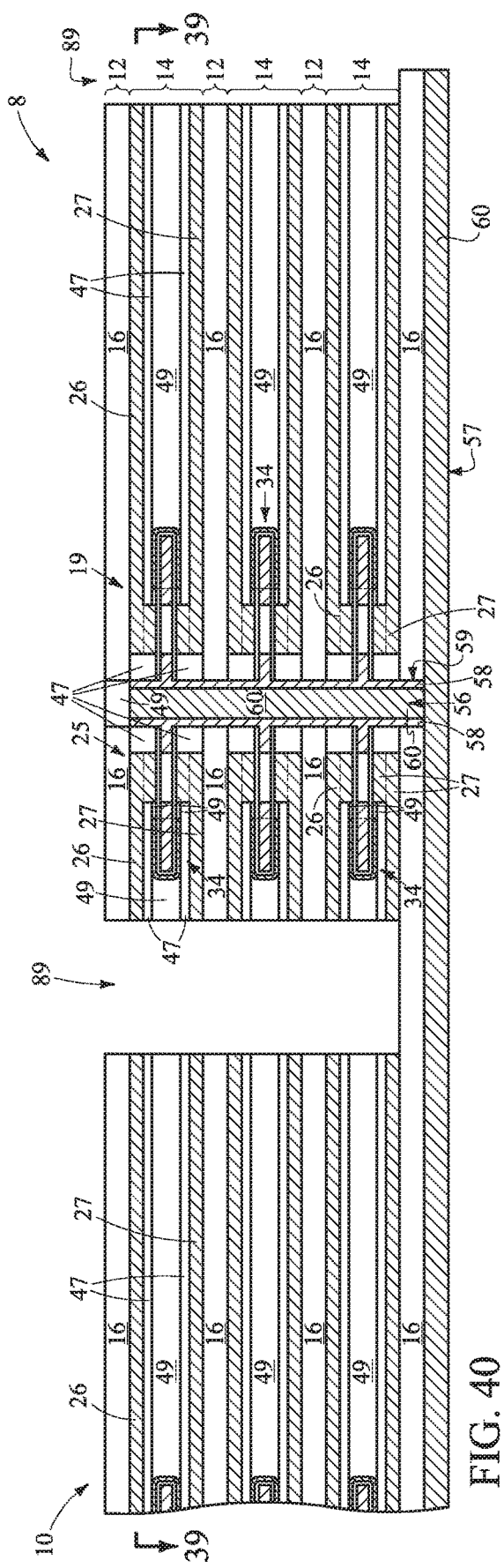
FIG. 40 is a sectional view taken through line 40-40 in FIG. 39, and is at the same larger scale as FIG. 14.

Referring to FIGS. 39 and 40, a trench 89 has been formed (e.g., using lithography and subtractive etch with or without pitch multiplication) as shown. Such effectively enables longitudinal outlines of access lines 90x and 90y (not shown yet) to be formed, as well as formation of capacitor-electrode structures 52 (not shown yet) as will be apparent from the continuing discussion.

Referring to FIGS. 41 and 42, example polysilicon material 26, 27 has been selectively etched as-shown (e.g., using TMAH), thereby forming the longitudinal outlines of access lines 90x and 90y.

Referring to FIGS. 43 and 44, example silicon-nitride-insulator material 47 has been used to plug the gaps/recesses formed by the etching shown in FIGS. 41 and 42, and then such material 47 has been removed from the main portion of trenches 89.

Figure 45:
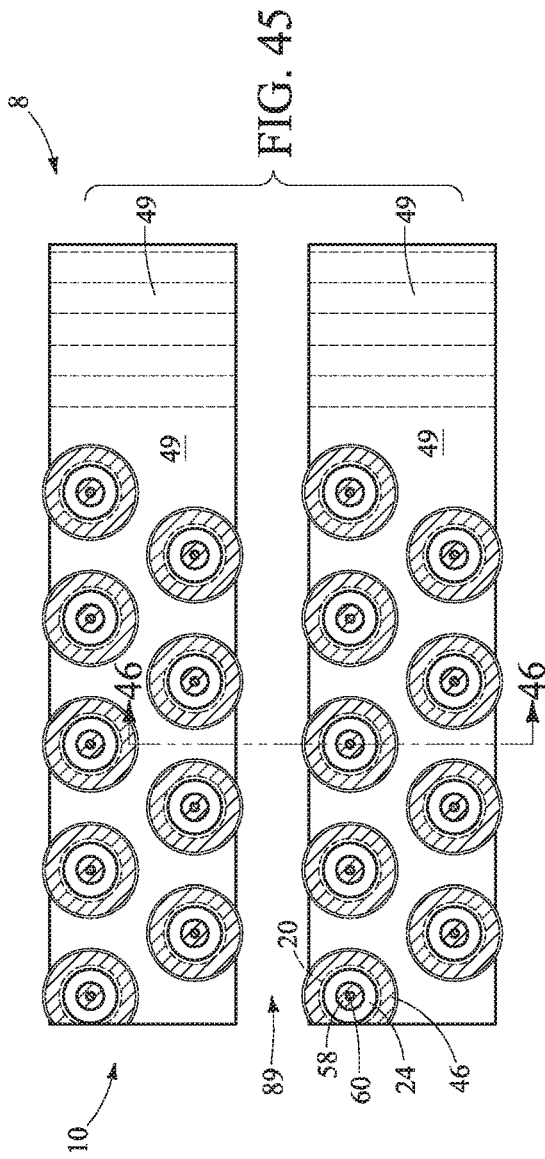
FIG. 45 is a sectional view of the FIG. 43 substrate at a processing step subsequent to that shown by FIG. 43, and is taken through line 45-45 in FIG. 46.
Figure 46:
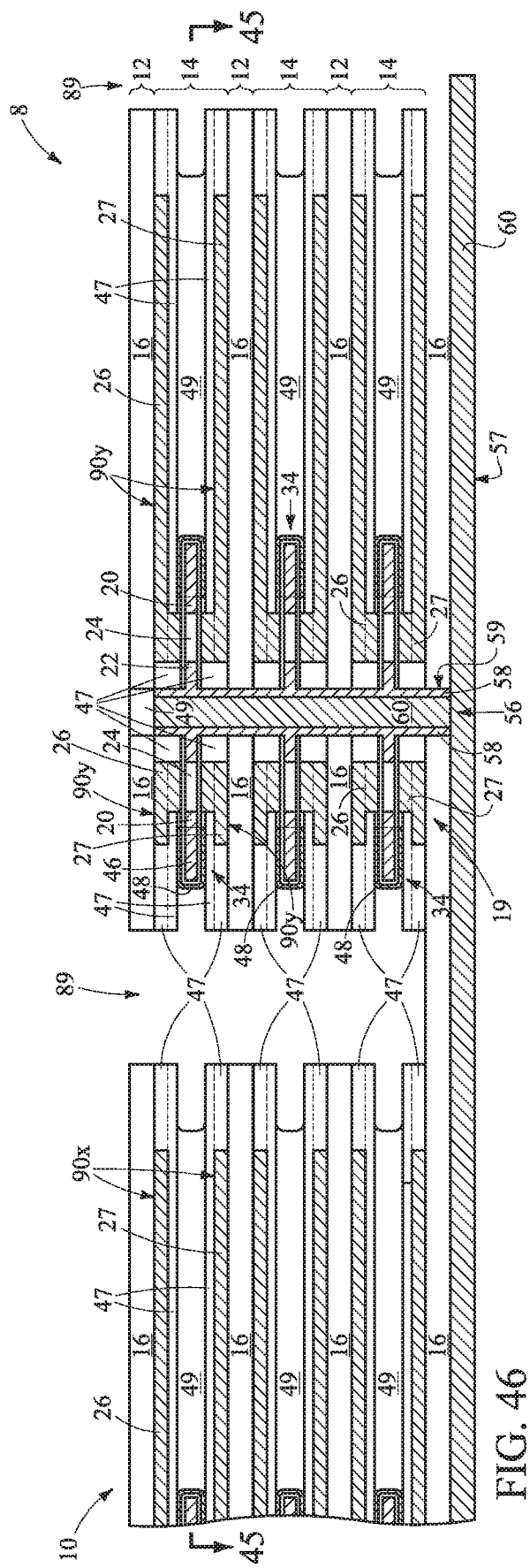
FIG. 46 is a sectional view taken through line 46-46 in FIG. 45, and is at the same larger scale as FIG. 14.

Referring to FIGS. 45 and 46, example silicon-dioxide-insulator material 49 has been etched selectively (e.g., using HF) laterally sufficient to expose ends of second capacitor electrode material 48 as shown.

Referring to FIGS. 47 and 48, additional second capacitor electrode material 48 has been deposited to fill trenches 89 and the gaps/recesses formed by the etching shown in FIGS. 45 and 46, thus completing formation of capacitor-electrode structures 52. Horizontally-elongated capacitor-electrode construction 29 may fabricated at this time (e.g., by subtractive patterning of material 48 of capacitor-electrode structures 52).

Referring to FIGS. 49 and 50, contact openings 96 have been formed in staircase region 15 to upwardly expose and overlap with conductive gate material 26 and 27 within individual memory cell tiers 14.

Figure 51:
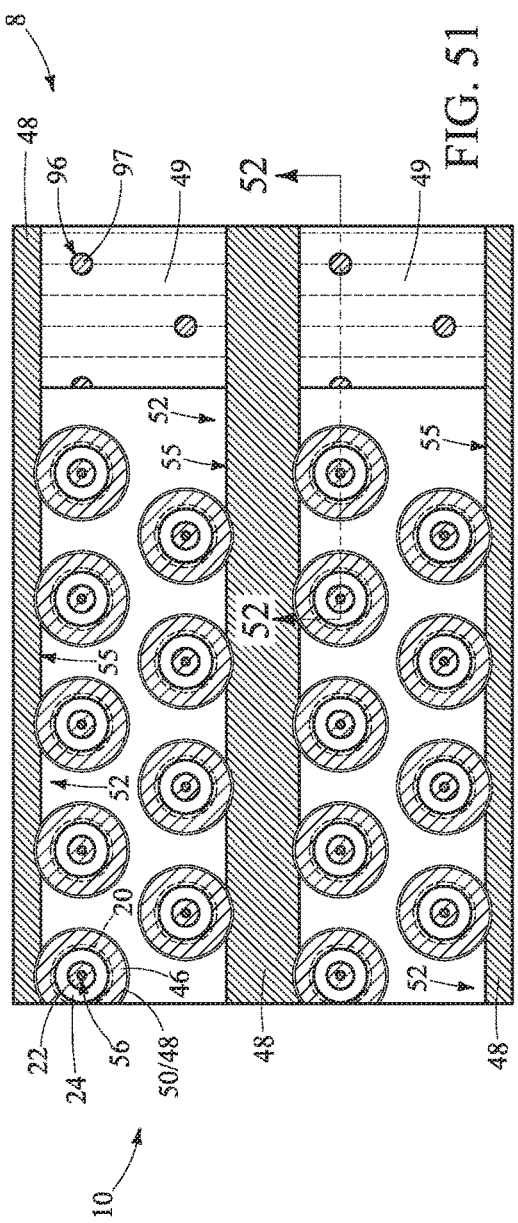
FIG. 51 is a sectional view of the FIG. 49 substrate at a processing step subsequent to that shown by FIG. 49, and is taken through line 51-51 in FIG. 52.
Figure 52:
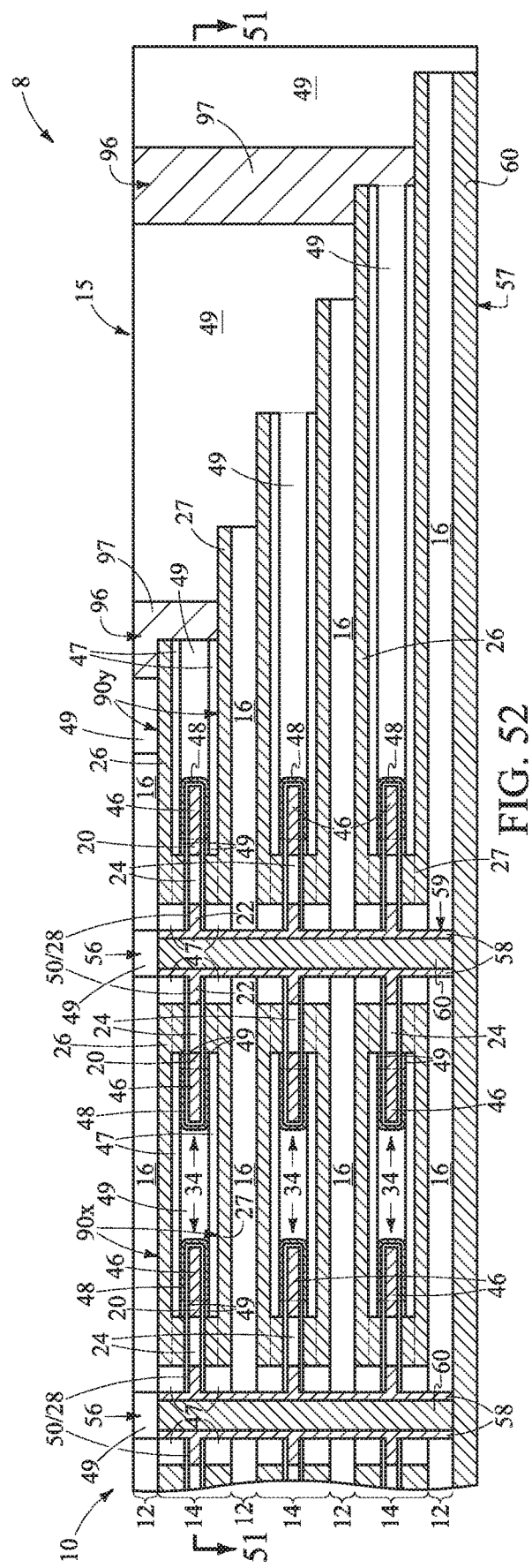
FIG. 52 is a sectional view taken through line 52-52 in FIG. 51, and is at the same larger scale as FIG. 14.

Referring to FIGS. 51 and 52, contact openings 96 have been filled with conductive material which has then been planarized back to form conductive vias 97.

CONCLUSION

In some embodiments, a memory array comprises vertically-alternating tiers of insulative material and memory cells. The memory cells individually include a transistor comprising first and second source/drain regions having a channel region there-between and a gate operatively proximate the channel region. At least a portion of the channel region is horizontally-oriented for horizontal current flow in the portion between the first and second source/drain regions. The memory cells individually include a capacitor comprising first and second electrodes having a capacitor insulator there-between. The first electrode is electrically coupled to the first source/drain region. The second capacitor electrodes of multiple of the capacitors in the array are electrically coupled with one another. A sense-line structure extends elevationally through the vertically-alternating tiers. Individual of the second source/drain regions of individual of the transistors that are in different memory cell tiers are electrically coupled to the elevationally-extending sense-line structure.

In some embodiments, a memory array comprises vertically-alternating tiers of insulative material and memory cells. The memory cells individually include a transistor comprising first and second source/drain regions having a channel region there-between and a gate operatively proximate the channel region. At least a portion of the channel region is horizontally-oriented for horizontal current flow in the portion between the first and second source/drain regions. The memory cells individually include a capacitor comprising first and second electrodes having a capacitor insulator there-between. The first electrode is electrically coupled to the first source/drain region. A capacitor-electrode structure extends elevationally through the vertically-alternating tiers. Individual of the second electrodes of individual of the capacitors that are in different memory cell tiers are electrically coupled to the elevationally-extending capacitor-electrode structure. A sense line is electrically coupled to multiple of the second source/drain regions of individual of the transistors.

In some embodiments, a memory array comprises vertically-alternating tiers of insulative material and memory cells. The memory cells individually include a transistor comprising first and second source/drain regions having a channel region there-between and a gate operatively proximate the channel region. At least a portion of the channel region is horizontally-oriented for horizontal current flow in the portion between the first and second source/drain regions. The memory cells individually include a capacitor comprising first and second electrodes having a capacitor insulator there-between. The first electrode is electrically coupled to the first source/drain region. A sense-line structure extends elevationally through the vertically-alternating tiers. Individual of the second source/drain regions of individual of the transistors that are in different memory cell tiers are electrically coupled to the elevationally-extending sense-line structure. A capacitor-electrode structure extends elevationally through the vertically-alternating tiers. Individual of the second electrodes of individual of the capacitors that are in different memory cell tiers are electrically coupled to the elevationally-extending capacitor-electrode structure.

In some embodiments, a memory array comprises vertically-alternating tiers of insulative material and memory cells. The memory cells individually include a transistor comprising first and second source/drain regions having a channel region there-between and a gate operatively proximate the channel region. At least a portion of the channel region is horizontally-oriented for horizontal current flow in the portion between the first and second source/drain regions. The memory cells individually include a capacitor comprising first and second electrodes having a capacitor insulator there-between. The first electrode is electrically coupled to the first source/drain region. The second capacitor electrodes of multiple of the capacitors in the array are electrically coupled with one another. A sense line is electrically coupled to multiple of the second source/drain regions of individual of the transistors that are in different memory cell tiers. Individual of the tiers of memory cells comprise two of the memory cells one of which is directly above the other in that individual tier of memory cells.

In some embodiments, a memory array comprises vertically-alternating tiers of insulative material and memory cells. The memory cells individually include a transistor comprising first and second source/drain regions having a channel region there-between and a gate operatively proximate the channel region. At least a portion of the channel region is horizontally-oriented for horizontal current flow in the portion between the first and second source/drain regions. The memory cells individually include a capacitor comprising first and second electrodes having a capacitor insulator there-between. The first electrode is electrically coupled to the first source/drain region. The second capacitor electrodes of multiple of the capacitors in the array are electrically coupled with one another. A sense line is electrically coupled to multiple of the second source/drain regions of individual of the transistors that are in different memory cell tiers. Individual of the tiers of memory cells comprise the gate and another gate. One of the gate and the another gate is directly above the other in that individual tier of memory cells.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array, comprising:
vertically-alternating tiers of insulative material and memory cells, the memory cells individually comprising:
 a transistor comprising first and second source/drain regions having a channel region there-between and a gate operatively proximate the channel region, at least a portion of the channel region being horizontally-oriented for horizontal current flow in the portion between the first and second source/drain regions; and
 a capacitor comprising first and second electrodes having a capacitor insulator there-between, the first electrode being electrically coupled to the first source/drain region, the second capacitor electrodes of multiple of the capacitors in the array being electrically coupled with one another; and
a sense-line structure extending elevationally through the vertically-alternating tiers, individual of the second source/drain regions of individual of the transistors that are in different memory cell tiers being electrically coupled to the elevationally-extending sense-line structure.

2. The array of claim 1 wherein all of the channel region is horizontally-oriented for horizontal current flow there-through.

3. The array of claim 1 wherein the first electrode is directly electrically coupled to the first source/drain region.

4. The array of claim 1 wherein the individual second source/drain regions are directly electrically coupled to the elevationally-extending sense-line structure.

5. The array of claim 1 wherein the sense-line structure is directly electrically coupled to a horizontal longitudinally-elongated sense line that is above or below the vertically-alternating tiers.

6. The array of claim 1 wherein the second capacitor electrodes of the multiple capacitors are directly electrically coupled with one another.

7. The array of claim 6 comprising an elevationally-extending wall that is longitudinally-elongated horizontally and that directly electrically couples the second capacitor electrodes of the multiple capacitors with one another.

8. The array of claim 1 wherein the second electrode is both directly above and directly below the first electrode in a straight-line vertical cross-section.

9. The array of claim 1 wherein the second electrode is not both directly above and directly below the first electrode in any straight-line vertical cross-section.

10. The array of claim 1 wherein the first electrode is both directly above and directly below the second electrode in a straight-line vertical cross-section.

11. The array of claim 1 wherein the channel-region comprises two channel-region segments spaced elevationally apart relative one another in a straight-line vertical cross-section.

12. The array of claim 11 wherein the two channel-region segments are directly electrically coupled to one another.

13. The array of claim 12 wherein the two channel-region segments are directly electrically coupled to one another by the first source/drain region.

14. The array of claim 1 wherein individual of the tiers of memory cells comprise two of the memory cells one of which is directly above the other in that individual tier of memory cells.

15. The array of claim 1 wherein individual of the memory cell tiers have no two of the memory cells that are directly above and directly below one another in that individual memory cell tier.

16. The array of claim 1 wherein individual of the tiers of memory cells comprise the gate and another gate, one of the gate and the another gate being directly above the other in that individual tier of memory cells.

17. The array of claim 1 wherein the channel region comprises an annulus in a straight-line horizontal cross-section.

18. The array of claim 1 wherein the first source/drain region comprises an annulus in a straight-line horizontal cross-section.

19. The array of claim 1 wherein the second source/drain region comprises an annulus in a straight-line horizontal cross-section.

20. The array of claim 1 wherein the first electrode comprises an annulus in a straight-line horizontal cross-section.

21. The array of claim 1 wherein the second electrode comprises an annulus in a straight-line horizontal cross-section.

22. The array of claim 1 wherein the gate comprises an annulus in a straight-line horizontal cross-section.

23. A memory array, comprising:
vertically-alternating tiers of insulative material and memory cells, the memory cells individually comprising:
 a transistor comprising first and second source/drain regions having a channel region there-between and a gate operatively proximate the channel region, at least a portion of the channel region being horizontally-oriented for horizontal current flow in the portion between the first and second source/drain regions; and
 a capacitor comprising first and second electrodes having a capacitor insulator there-between, the first electrode being electrically coupled to the first source/drain region;
a capacitor-electrode structure extending elevationally through the vertically-alternating tiers, individual of the second electrodes of individual of the capacitors that are in different memory cell tiers being electrically coupled to the elevationally-extending capacitor-electrode structure; and a sense line electrically coupled to multiple of the second source/drain regions of individual of the transistors.

24. The array of claim 23 wherein the capacitor-electrode structure is directly electrically coupled to a horizontally-elongated capacitor-electrode construction that is above or below the vertically-alternating tiers.

25. The array of claim 23 wherein the capacitor-electrode structure comprises an elevationally-extending wall that is longitudinally-elongated horizontally and that directly electrically couples the individual second capacitor together.

26. A memory array, comprising:
vertically-alternating tiers of insulative material and memory cells, the memory cells individually comprising:
   a transistor comprising first and second source/drain regions having a channel region there-between and a gate operatively proximate the channel region, at least a portion of the channel region being horizontally-oriented for horizontal current flow in the portion between the first and second source/drain regions; and
   a capacitor comprising first and second electrodes having a capacitor insulator there-between, the first electrode being electrically coupled to the first source/drain region;
a sense-line structure extending elevationally through the vertically-alternating tiers, individual of the second source/drain regions of individual of the transistors that are in different memory cell tiers being electrically coupled to the elevationally-extending sense-line structure; and
a capacitor-electrode structure extending elevationally through the vertically-alternating tiers, individual of the second electrodes of individual of the capacitors that are in different memory cell tiers being electrically coupled to the elevationally-extending capacitor-electrode structure.

27. A memory array, comprising:
vertically-alternating tiers of insulative material and memory cells, the memory cells individually comprising:
   a transistor comprising first and second source/drain regions having a channel region there-between and a gate operatively proximate the channel region, at least a portion of the channel region being horizontally-oriented for horizontal current flow in the portion between the first and second source/drain regions; and
   a capacitor comprising first and second electrodes having a capacitor insulator there-between, the first electrode being electrically coupled to the first source/drain region, the second capacitor electrodes of multiple of the capacitors in the array being electrically coupled with one another;
a sense line electrically coupled to multiple of the second source/drain regions of individual of the transistors that are in different memory cell tiers; and
individual of the tiers of memory cells comprising two of the memory cells one of which is directly above the other in that individual tier of memory cells.

28. The array of claim 27 wherein all of the channel region is horizontally-oriented for horizontal current flow there-through.

29. A memory array, comprising:
vertically-alternating tiers of insulative material and memory cells, the memory cells individually comprising:
   a transistor comprising first and second source/drain regions having a channel region there-between and a gate operatively proximate the channel region, at least a portion of the channel region being horizontally-oriented for horizontal current flow in the portion between the first and second source/drain regions; and
   a capacitor comprising first and second electrodes having a capacitor insulator there-between, the first electrode being electrically coupled to the first source/drain region, the second capacitor electrodes of multiple of the capacitors in the array being electrically coupled with one another;
a sense line electrically coupled to multiple of the second source/drain regions of individual of the transistors that are in different memory cell tiers; and
individual of the tiers of memory cells comprising the gate and another gate, one of the gate and the another gate being directly above the other in that individual tier of memory cells.

30. The array of claim 29 wherein the gate and the another gate are directly electrically coupled to one another.

31. The array of claim 29 wherein the gate and the another gate are not directly electrically coupled to one another.

32. The array of claim 29 wherein the one of the gate and the another gate extends longitudinally directly above the capacitor in a straight-line vertical cross-section.

33. The array of claim 29 wherein the other of the gate and the another gate extends longitudinally directly under the capacitor in a straight-line vertical cross-section.

34. The array of claim 33 wherein the one of the gate and the another gate extends longitudinally directly above the capacitor in the straight-line vertical cross-section.

* * * * *